(12) United States Patent
Kim et al.

(10) Patent No.: US 7,651,729 B2
(45) Date of Patent: Jan. 26, 2010

(54) METHOD OF FABRICATING METAL SILICATE LAYER USING ATOMIC LAYER DEPOSITION TECHNIQUE

(75) Inventors: Yun-Seok Kim, Seoul (KR); Jong-Pyo Kim, Seongnam-si (KR); Ha-Jin Lim, Seoul (KR); Jae-Eun Park, Yongin-si (KR); Hyung-Suk Jung, Suwon-si (KR); Jong-Ho Lee, Suwon-si (KR); Jong-Ho Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 746 days.

(21) Appl. No.: 11/127,748

(22) Filed: May 12, 2005

(65) Prior Publication Data

US 2005/0255246 A1    Nov. 17, 2005

Related U.S. Application Data

(60) Provisional application No. 60/618,106, filed on Oct. 13, 2004.

(30) Foreign Application Priority Data

May 14, 2004    (KR)    ................ 10-2004-0034431
Nov. 30, 2004   (KR)    ................ 10-2004-0099511

(51) Int. Cl.
*C23C 16/00* (2006.01)
(52) U.S. Cl. .............. 427/248.1; 118/722; 365/200; 427/250; 427/252; 427/255.4; 427/255.7
(58) Field of Classification Search ............ 118/722; 427/248.1; 365/200
See application file for complete search history.

(56) References Cited

U.S. PATENT DOCUMENTS 7,196,007 B2    3/2007    Vaartstra

2001/0024387 A1*    9/2001    Raaijmakers et al. ........ 365/200
2003/0031793 A1    2/2003    Chang et al. ............ 427/255.28

(Continued)

FOREIGN PATENT DOCUMENTS

JP    2003-347297    12/2003

(Continued)

*Primary Examiner*—Michael Barr
*Assistant Examiner*—Andrew Bowman
(74) *Attorney, Agent, or Firm*—Mills & Onello, LLP

(57) ABSTRACT

There are provided methods of fabricating a metal silicate layer on a semiconductor substrate using an atomic layer deposition technique. The methods include performing a metal silicate layer formation cycle at least one time in order to form a metal silicate layer having a desired thickness. The metal silicate layer formation cycle includes an operation of repeatedly performing a metal oxide layer formation cycle K times and an operation of repeatedly performing a silicon oxide layer formation cycle Q times. K and Q are integers ranging from 1 to 10 respectively. The metal oxide layer formation cycle includes the steps of supplying a metal source gas to a reactor containing the substrate, exhausting the metal source gas remaining in a reactor to clean the inside of the reactor, and then supplying an oxide gas into the reactor. The silicon oxide layer formation cycle includes supplying a silicon source gas, exhausting the silicon source gas remaining in the reactor to clean the inside of the reactor, and then supplying an oxide gas into the reactor.

41 Claims, 9 Drawing Sheets

U.S. PATENT DOCUMENTS

| | | |
|---|---|---|
| 2004/0105935 A1 | 6/2004 | Park et al. |
| 2005/0056219 A1* | 3/2005 | Dip et al. .................. 118/722 |
| 2006/0258078 A1 | 11/2006 | Lee et al. |

FOREIGN PATENT DOCUMENTS

| | | |
|---|---|---|
| JP | 2003-347298 | 12/2003 |
| KR | 10-2002-0032054 | 5/2002 |
| KR | 10-2003-0018134 | 3/2003 |
| KR | 10-2004-0041944 | 5/2004 |
| KR | 10-2005-0109036 | 11/2005 |

* cited by examiner

METHOD OF FABRICATING METAL SILICATE LAYER USING ATOMIC LAYER DEPOSITION TECHNIQUE

CROSS-REFERENCE TO RELATED APPLICATION

This application claims priority from Korean Patent Application Nos. 2004-0034431 and 2004-0099511, filed May 14, 2004 and Nov. 30, 2004 respectively, the disclosures of which are hereby incorporated herein by reference in their entirety as if set forth fully herein. This application also claims priority based on U.S. provisional application Ser. No. 60/618, 106, filed Oct. 13, 2004.

BACKGROUND OF INVENTION

1. Technical Field

The present invention relates to a method of fabricating a thin layer of a semiconductor device, and more particularly, to a method of fabricating a metal silicate layer using an atomic layer deposition (ALD) technique.

2. Discussion of the Related Art

With growing demand for highly-integrated semiconductor devices, a transistor and a capacitor as component semiconductor elements must be fabricated increasingly small to accommodate the smaller size requirements. The transistor and the capacitor elements typically include dielectrics. Efforts to reduce such dielectrics in both overall size and thickness have led, however, to many difficulties in fabrication.

For example, if a thickness of a gate dielectric layer as one component element of the transistor is formed too thin, there may result a deterioration in the insulation characteristics of the gate dielectric layer. A silicon oxide layer is normally used as a material to form the gate dielectric layer. In the case where a thickness of the silicon oxide layer is reduced to about 15 Å or less, it has been reported that there occurs a rapid increase in leakage current apparently caused by a direct tunneling effect in a gate electrode. As one solution to solve the problem described above, there have been efforts to study the use of high-k dielectrics which have a higher dielectric constant and a lower leakage current than those of the silicon oxide layer even when used in thin dielectric layers.

In recent years, a metal silicate layer, such as a hafnium silicate (HfSiOx) layer, as the high-k dielectrics has been proposed. Such a metal silicate layer typically has an excellent mobility of carriers in comparison with Is other high-k dielectrics when such metal silicate layer is employed in a semiconductor transistor.

The conventional method of fabricating such a metal silicate layer uses physical vapor deposition (PVD) and chemical vapor deposition (CVD). As widely known, the PVD technique has serious limitations because of a poor step coverage and poor interface characteristics with a silicon substrate. The CVD technique also has serious limitations because of the need to use high temperatures to form thin films, and because of limitations in being able to precisely control the thickness of the thin film within a tolerance of several Å. Further, because a composition ratio in a PVD or CVD thin film is difficult to control, the conventional methods of fabricating the metal silicate layer were found not suitable to being employed to fabricate a highly-integrated semiconductor device.

Therefore, an atomic layer deposition (ALD) technique has been studied as an alternative method of fabricating a metal silicate layer having a precise thickness by unit of an atomic layer to overcome the limitations of the CVD and PVD techniques. The ALD technique is a method of supplying source gases in a controlled, ordered sequence, with a discrete pulse type by time-division, rather than supplying source gases concurrently in order to form thin films. The supply of the various gases can be conducted by opening/closing valves provided to respective gas conduits with time variance such that process gases are not mixed, and each source gas can be individually supplied into a reactor according to a predetermined interval of time. When each of the source gases is supplied at a predetermined flow rate with such a time variance, a purge gas is also supplied between time intervals of supplying gases to remove the unreacted source gas remaining in the reactor. The ALD technique has the advantages of providing excellent step coverage and depositing a uniform thin film on a large-sized substrate, and also enabling precise control of the thickness of the thin film by controlling the number of repeated deposition cycles.

A general method of fabricating a metal silicate layer using the ALD technique has been disclosed in U.S. patent application Publication No. 2003-0031793 titled "METHOD FOR DEPOSITING A COATING HAVING A RELATIVELY HIGH DIELECTRIC CONSTANT ONTO A SUBSTRATE" by Cheng, et al., which publication is also incorporated herein by reference.

According to Cheng, et al., an aluminum oxide ($Al_2O_3$) layer, a tantalum oxide ($Ta_2O_5$) layer, and a hafnium oxide ($HfO_2$) layer as a metal oxide layer, and a zirconium silicate ($SiZrO_4$) layer and a hafnium silicate (HfSiOx) layer as a metal silicate layer, and the like, are formed on a semiconductor substrate. In specific, in Cheng et al. the semiconductor substrate is loaded into a reactor. A first precursor gas is supplied to the overall surface of a suitable substrate and then is purged from the reaction chamber. The first precursor, adsorbed on the overall surface of the substrate, is then oxidized by using an oxide gas such as oxygen, water vapor, dinitrogen monoxide ($N_2O$), or the like. These operations are repeatedly performed until a first thin film with a desired thickness is formed on the substrate. A second precursor gas is then supplied to the overall surface of the first thin film deposited on the substrate and then is purged. The second precursor, adsorbed on the overall surface of the first thin film on the substrate, is then oxidized by using an oxide gas such as oxygen, water vapor, dinitrogen monoxide ($N_2O$), or the like. These operations are repeatedly performed until a metal silicate layer with a desired thickness is formed on the first thin film layer.

Another method of fabricating a metal silicate layer has been disclosed in Japanese Patent Publication No. 2003-347298 titled "METHOD OF FABRICATING A SEMICONDUCTOR DEVICE AND AN APPARATUS OF PROCESSING A SUBSTRATE," which publication is also incorporated herein by reference.

According to Japanese Patent Publication No. 2003-347298, a high-k dielectric including a hafnium silicate (HfSiOx) layer can be fabricated. In specific, a first layer source material gas is supplied to a suitable semiconductor substrate and then is purged from the reaction chamber. A remote-plasma oxidation (RPO) process is then performed to supply oxygen radicals to the first layer source material adsorbed on the substrate. These process steps are repeatedly performed for a determined number of repeated cycles in order to form a first layer of a desired thickness. A second material source gas is then supplied to the surface of the resultant structure, and then the layer surface is processed, i.e., the RPO process for supplying oxygen radicals to the surface is performed. These process steps are repeatedly performed for a determined number of repeated cycles so as to form a thin film of a desired thickness.

When the metal silicate layer is formed by one of the methods disclosed in U.S. patent application Publication No. 2003-0031793 or in Japanese Patent Publication No. 2003-347298, after the metal oxide layer formation process is repeatedly performed for a determined number of repeated cycles, a silicon source gas is supplied to the structure. Generally, such silicon source gas has a chemically stable structure relative to the metal oxide layer. As a result, there are many limitations in these methods of converting the metal oxide layer to the desired metal silicate layer using such silicon source gas. For example, it has been found to be very difficult to convert the metal oxide layer to the metal silicate layer after repeatedly performing the metal oxide layer formation process by about 10 times or more, and thereafter supplying the silicon source gas. Instead of such processing leading to the formation of the desired metal silicate layer, the silicon oxide layer may be separately stacked on the metal oxide layer, or the reaction and/or formation of the silicon oxide layer on the metal oxide layer may not occur at all or only along portions of the surface and not uniformly.

SUMMARY OF THE INVENTION

Therefore, the present invention provides a method of fabricating a metal silicate layer on a suitable semiconductor substrate, wherein the method is capable of precisely controlling the thicknesses of the thin films and also of controlling the composition ratios of metal and silicon in the resultant metal silicate layer.

Another more specific object of the present invention is to provide a method of fabricating a hafnium silicate layer on a semiconductor substrate while also precisely controlling thicknesses of the thin films and also controlling the composition ratios of hafnium and silicon in the resultant hafnium silicate layer.

In accordance with an exemplary embodiment, the present invention provides a method of fabricating a metal silicate layer using an atomic layer deposition technique. The method generally includes the sequential steps of loading a substrate into a reactor or chamber and then supplying a suitable metal source gas into the reactor or chamber having the substrate in order to form a chemical adsorption layer including the metal on the substrate surface. Typically following a purging step, an oxide gas is supplied into the reactor to react with the chemical adsorption layer including the metal, thereby forming a metal oxide layer on the substrate. The sequential operations of supplying a metal source gas to the reactor, purging, and supplying an oxide gas to form a metal oxide layer (the metal/oxide steps) are repeatedly performed a determined number, e.g., K, times. A suitable silicon source gas is then supplied into the reactor in order to form a chemical adsorption layer including silicon on the metal oxide layer previously formed on the substrate. Typically following another purging step, an oxide gas is supplied into the reactor to react with the metal oxide layer and the chemical adsorption layer deposited thereon, including the silicon, thereby forming a metal silicate layer. The operations of supplying a silicon source gas to the reactor, purging and supplying an oxide gas to form a metal silicate layer (the silicon/oxide steps) are repeatedly performed a determined number, e.g., Q, times. One of the values K and Q is at least 2. The complete sequential operation beginning with the step of supplying a metal source gas through the step of forming a metal silicate layer is performed at least one time, and may be performed two or more times, thereby forming a metal silicate layer having a desired thickness.

In accordance with exemplary embodiments of this invention, the method may further advantageously include such related steps as cleaning (or purging) the reactor after a step of supplying the various reactant gases. In specific, the unreacted metal source gas remaining in the reactor after the step of forming the chemical adsorption layer including the metal may be exhausted to clean the inside of the reactor. The unreacted oxide gas and any gaseous reaction byproducts remaining in the reactor after the step of forming the metal oxide layer may be exhausted to clean the inside of the reactor. The unreacted silicon source gas remaining in the reactor after the step of forming the chemical adsorption layer including the silicon may likewise be exhausted to clean the inside of the reactor. The unreacted oxide gas and any gaseous reaction byproducts remaining in the reactor after forming the metal silicate layer may be exhausted to clean the inside of the reactor. In one invention embodiment, a purge gas may be supplied into the reactor in order to exhaust the unreacted gases and the byproducts. The purge gas normally will comprise a substantially inert gas (relative to the reaction environment) such as argon (Ar), helium (He), or nitrogen ($N_2$).

The number of cycle repetitions K and Q, as defined above, are preferably in the range of 1 to about 10. For example, the number K may for some common applications advantageously be in the range of 2 to 5, and the number Q may be 1. If the number K is 10 or more, however, it has been found that the metal oxide layer formed during the operation of forming the metal oxide layer has a chemically stable structure. Because such a metal oxide layer (where K≧10) has a chemically stable structure, it makes it more difficult to form a successful and generally uniform metal silicate layer. Further, it has been found that if the number Q is 10 or more, even though the silicon source gas may be further supplied to the metal silicate layer, the formation of a chemical adsorption layer including the silicon typically does not occur. That is, if the number Q is 10 or more, the metal silicate layer is not further formed. The metal silicate layer according to this invention may be represented by the chemical formula, $M_xSi_{1-x}O_2$ wherein: M is an element selected from the group consisting of Hf, Zr and Ti, and "x" represents a composition ratio of metal to silicon in the metal silicate layer. By determining and controlling the numbers K and Q during the layer formation operation, the "x" may be controlled, for example in the range of about 0.10~0.95. More preferably, the "x" may be controlled to be in the range of about 0.65~0.85. That is, by appropriately controlling the number of film deposition cycles (K and Q respectively), a metal silicate layer with a desired composition ratio can be formed on the semiconductor substrate.

In accordance with a more specific exemplary embodiment, the present invention provides a method of fabricating a hafnium silicate layer on a suitable semiconductor substrate using an atomic layer deposition technique. The method generally includes the sequential steps of loading a substrate into a reactor or chamber and then supplying a tetrakis(ethylmethylamino)hafnium (TEMAH) ($Hf[N(CH_3)C_2H_5]_4$) gas into the reactor having the substrate in order to form a chemical adsorption layer including hafnium (Hf) on the substrate surface. Typically following a purging step, an oxide gas is supplied into the reactor to react with the chemical adsorption layer including hafnium (Hf), thereby forming a hafnium (Hf) oxide layer on the substrate. The sequential operations of supplying the TEMAH gas to the reactor, purging, and supplying an oxide gas to form the hafnium (Hf) oxide layer are repeatedly performed a determined number, e.g., K, times. A hexachlorodisilane (HCD) ($Si_2Cl_6$) gas is then supplied into the reactor in order to form a chemical adsorption layer including silicon on the hafnium oxide layer previously formed on the substrate. Typically following another purging step, an oxide gas is supplied into the reactor to react with the hafnium (Hf) oxide layer and the chemical adsorption layer deposited thereon, including the silicon, thereby forming a hafnium silicate ($Hf_xSi_{1-x}O_2$) layer. The operations of supplying the HCD gas to the reactor, purging, and supplying an oxide gas to form the hafnium silicate layer are repeatedly performed a determined number, e.g., Q, times. One of the values K and Q is at least 2. The complete sequential operation beginning with the step of supplying the TEMAH gas through the step of forming the hafnium silicate layer is performed at least one time, and may be performed two or more times, thereby forming a hafnium silicate layer having a desired thickness.

In accordance with exemplary embodiments of this invention, the method may further advantageously include such related steps as cleaning (or purging) the reactor after a step of supplying the various reactant gases. In specific, the unreacted TEMAH gas remaining in the reactor after the step of forming the chemical adsorption layer including the hafnium (Hf) can be exhausted to clean the inside of the reactor. The unreacted oxide gas and any gaseous reaction byproducts remaining in the reactor after the step of forming the hafnium (Hf) oxide layer can be exhausted to clean the inside of the reactor. The unreacted HCD gas remaining in the reactor after the step of forming the chemical adsorption layer including the silicon can likewise be exhausted to clean the inside of the reactor. The unreacted oxide gas and any gaseous reaction byproducts remaining in the reactor after forming the hafnium silicate layer can be exhausted to clean the inside of the reactor. Examples of suitable purge gases for use in such reactor cleaning steps are as previously described.

The number of cycle repetitions, K and Q, as defined above are preferably in the range of 1 to about 10. For example, the number K may be in the range of 2 to 5, and the number Q may be 1. If the number K is 10 or more, however, it has been found that the hafnium oxide layer formed during the operation of forming the hafnium oxide layer has a chemically stable structure. Because such a hafnium oxide layer (where K≧10) has a chemically stable structure, it makes it more difficult to form a successful and generally uniform hafnium silicate layer. Further, it has been found that if the number Q is 10 or more, even though the hexachlorodisilane (HCD) ($Si_2Cl_6$) gas may be further supplied to the hafnium silicate layer, the formation of a chemical adsorption layer including the silicon typically does not occur. That is, if the number Q is 10 or more, the hafnium silicate layer is not further formed. The hafnium silicate layer according to this invention may be represented by the chemical formula, $Hf_xSi_{1-x}O_2$ wherein "x" represents a composition ratio of hafnium (Hf) relative to hafnium+silicon in the hafnium silicate layer. By determining and controlling the numbers K and Q during the layer formation operation, the "x" may be controlled, for example in the range of about 0.10~0.95. More preferably, the "x" may be controlled to be in the range of about 0.65~0.85. That is, by appropriately controlling the number of film deposition cycles (K and Q respectively), a hafnium silicate ($Hf_xSi_{1-x}O_2$) layer with a desired composition ratio can be formed on the substrate.

In accordance with other exemplary embodiments, the present invention also provides other somewhat similar methods of fabricating a hafnium silicate layer. One such other method generally includes the sequential steps of loading a substrate into a reactor and then supplying a tetrakis(ethylmethylamino)hafnium (TEMAH) ($Hf[N(CH_3)C_2H_5]_4$) gas into the reactor having the substrate in order to form a chemical adsorption layer including hafnium (Hf) on the substrate surface. Typically following a purging step, an oxide gas is supplied into the reactor to react with the chemical adsorption layer including hafnium (Hf), thereby forming a hafnium (Hf) oxide layer on the substrate. The sequential operations of supplying the TEMAH gas to the reactor, purging, and supplying an oxide gas to form the hafnium (Hf) oxide layer are repeatedly performed a determined number, e.g., K, times. A tris(dimethylamino)silane (TDMAS) ($[(CH_3)_2N]_3SiH$) gas is then supplied into the reactor in order to form a chemical adsorption layer including silicon on the hafnium oxide layer previously formed on the substrate. Typically following another purging step, an oxide gas is supplied into the reactor to react with the hafnium (Hf) oxide layer and the chemical adsorption layer deposited thereon, including the silicon, thereby forming a hafnium silicate ($Hf_xSi_{1-x}O_2$) layer. The operations of supplying the TDMAS gas to the reactor, purging, and supplying an oxide gas to form the hafnium silicate layer are repeatedly performed a determined number, e.g., Q, times. One of the values K and Q is at least 2. The complete sequential operation beginning with the step of supplying the TEMAH gas through the step of forming the hafnium silicate layer is performed at least one time, and may be performed two or more times, thereby forming a hafnium silicate layer having a desired thickness.

In accordance with exemplary embodiments of this invention, the method may further advantageously include such related steps as cleaning (or purging) the reactor after a step of supplying the various reactant gases. In specific, the unreacted TEMAH gas remaining in the reactor after the step of forming the chemical adsorption layer including the hafnium (Hf) may be exhausted to clean the inside of the reactor. The unreacted oxide gas and any gaseous reaction byproducts remaining in the reactor after the step of forming the hafnium (Hf) oxide layer may be exhausted to clean the inside of the reactor. The unreacted TDMAS gas remaining in the reactor after the step of forming the chemical adsorption layer including the silicon may likewise be exhausted to clean the inside of the reactor. The unreacted oxide gas and any gaseous reaction byproducts remaining in the reactor after forming the hafnium silicate layer may be exhausted to clean the inside of the reactor. Examples of suitable purge gases for use in such reactor cleaning steps are as previously described.

The number of cycle repetitions K and Q, as defined above are preferably in the range of 1 to about 10. For example, the number K may be in the range of 1 to 3, and the number Q may be 1. If the number K is 10 or more, however, it has been found that the hafnium oxide layer formed during the operation of forming the hafnium oxide layer has a chemically stable structure. Because such a hafnium oxide layer (where K≧10) has a chemically stable structure, it makes it more difficult to form a successful and generally uniform hafnium silicate layer. Further, it has been found that if the number Q is 10 or more, even though the tris(dimethylamino)silane (TDMAS) ($[(CH_3)_2N]_3SiH$) gas may be further supplied to the hafnium silicate layer, the formation of a chemical adsorption layer including the silicon typically does not occur. That is, if the number Q is 10 or more, the hafnium silicate layer is not further formed. The hafnium silicate layer according to this invention may be represented by the chemical formula, $Hf_xSi_{1-x}O_2$ wherein "x" represents a composition ratio of hafnium (Hf) relative to hafnium+silicon in the hafnium silicate layer. By determining and controlling the numbers K and Q during the layer formation operation, the "x" may be controlled, for example in the range of about 0.10~0.95. More preferably, the "x" may be controlled to be in the range of about 0.65~0.85. That is, by appropriately controlling the number of film deposition cycles (K and Q respectively), a hafnium silicate ($Hf_xSi_{1-x}O_2$) layer with a desired composition ratio can be formed on the substrate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
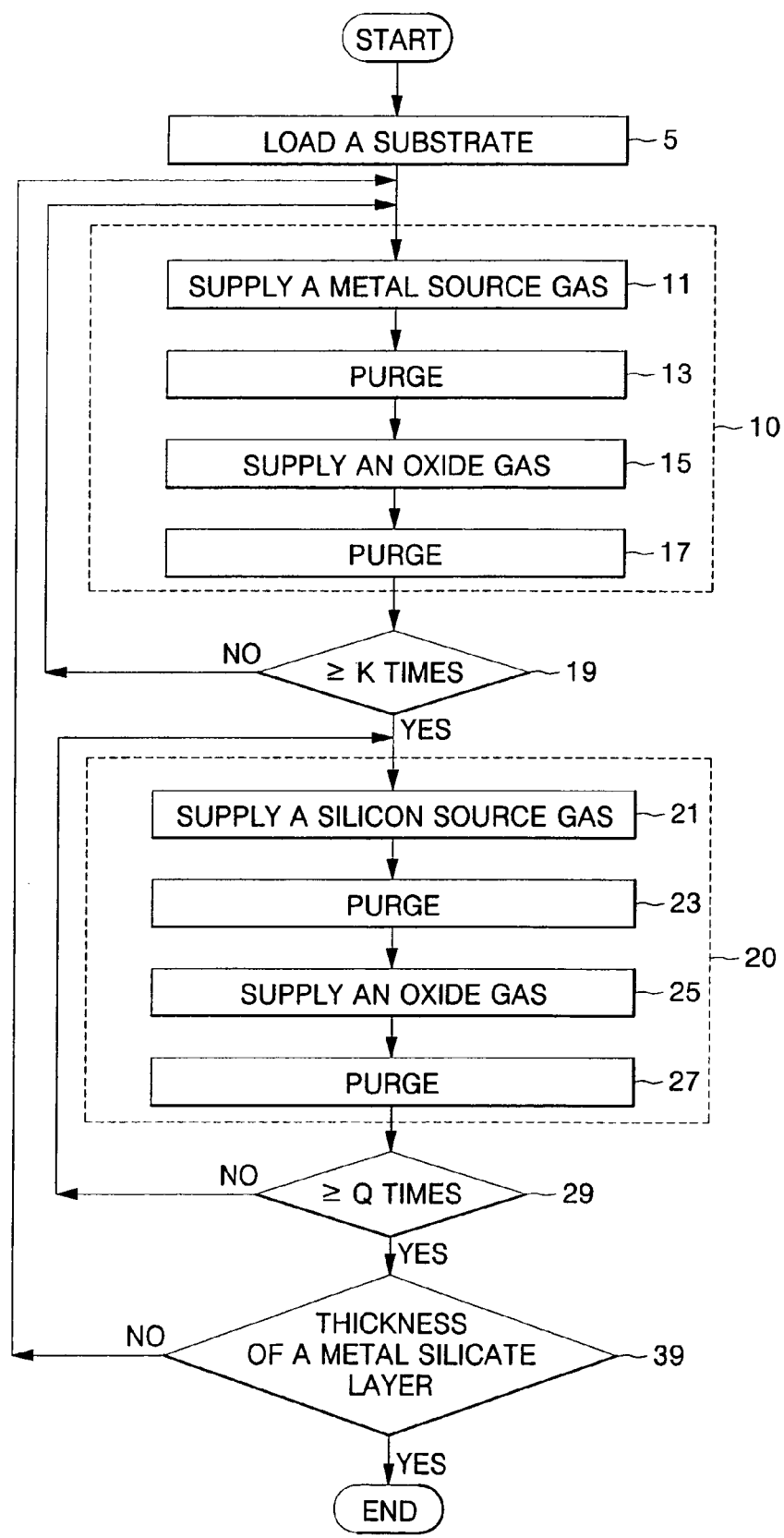
FIG. 1 is a process flow chart generally illustrating a method of is fabricating a metal silicate layer using an ALD technique according to the present invention.

The present invention will now be described more fully hereinafter with reference to the accompanying drawings, in which preferred embodiments of the invention are shown. it will be understood, however, that this invention may be embodied in many different forms and should not be construed as being limited to the embodiments set forth herein. Rather, these embodiments are provided so that this disclosure will be thorough and complete, and will fully convey the scope of the invention to those skilled in the art. Like numbers in the drawings are used to refer to like elements throughout the specification.

Figure 2:
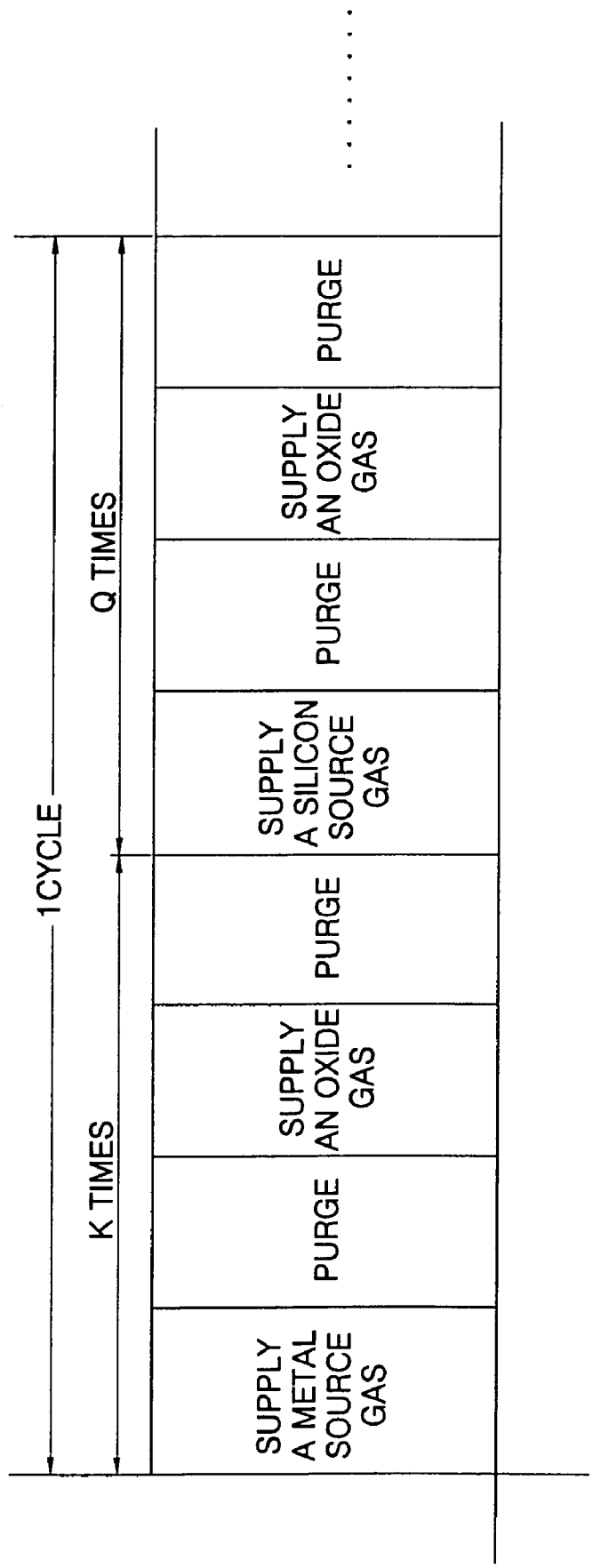
FIG. 2 is a diagram of a single complete layer deposition cycle (which may include a number K of metal/oxide steps and a number Q of silicon/oxide steps) illustrating a method of fabricating a metal silicate layer using an ALD technique according to the present invention.

FIG. 1 is a process flow chart generally illustrating a method of fabricating a metal silicate layer using an ALD technique according to the present invention, and FIG. 2 is a diagram of a single complete layer deposition cycle illustrating a method of fabricating a metal silicate layer using an ALD technique according to the present invention.

Referring to FIGS. 1 and 2, the general method of fabricating a metal silicate layer according to embodiments of the present invention includes an initial or preliminary step of loading a suitable semiconductor substrate into a reactor or chamber comprising part of an atomic layer deposition (ALD) system (step 5 of FIG. 1).

The reactor may be a slice type or batch type. The substrate may be a semiconductor substrate such as a silicon substrate, and the substrate may have an isolation layer already formed thereon. Further, the substrate may have a three-dimensional structure, such as a lower electrode of a cylindrical-shaped capacitor formed thereon, and thus may include a plurality of different surfaces located in different planes. The methods of this invention may be used to form a metal silicate layer on any or all of such substrate surfaces.

The inside of the reactor is heated to a temperature suitable to performing the fabrication processes of this invention. For example, an appropriate temperature for the processes is in the range of about 250° C. to 600° C.

The metal oxide layer formation cycle 10 (comprising the separate, individual steps 11, 13, 15 and 17) is repeatedly performed K times on the substrate, thereby forming a metal oxide layer with a desired thickness. The metal oxide layer formation cycle 10 may include the individual steps of supplying a metal source gas (step 11 of FIG. 1), exhausting unreacted metal source gas remaining in the reactor to clean the inside of the reactor (step 13 of FIG. 1), supplying an oxide gas into the reactor (step 15 of FIG. 1), and cleaning the inside of the reactor (step 17 of FIG. 1).

In specific, the metal source gas is supplied into the reactor having the substrate loaded therein (step 11 of FIG. 1). In one embodiment, the metal source gas is a material having the general chemical formula $MX_4$, wherein M is an element selected from the group consisting of Hf, Zr and Ti, and X is an element selected from the group consisting of F, Cl, Br and I. In another embodiment, the metal source gas is a material having the general chemical formula $M(NRR')_4$, wherein M is an element selected from the group consisting of Hf, Zr and Ti; N is nitrogen; R is a chemical group selected from the group consisting of H, Me, Et and $^i$Pr; and R' is a chemical group selected from the group consisting of H, Me, Et and $^i$Pr. Further, the metal source gas may also specifically be tetrakis (ethylmethylamino)hafnium (TEMAH) ($Hf[N(CH_3)C_2H_5]_4$). For example, in the case of supplying the TEMAH, the pulse time for supplying the metal source gas may be about 0.2~2 seconds. As a result, a chemical adsorption layer including the metal is formed along exposed surface(s) of the substrate. After the chemical adsorption layer including the metal is formed, the metal source gas remaining in the reactor is exhausted to clean the inside of the reactor (step 13 of FIG. 1). In order to exhaust the metal source gas, or to assist in such step, a purge gas may be supplied to the inside of the reactor. The purge gas normally comprises a substantially inert gas such as argon (Ar), helium (He), or nitrogen ($N_2$). Then, the oxide gas is supplied into the reactor (step 15 of FIG. 1). The oxide gas may be at least one member selected from the group consisting of oxygen ($O_2$), ozone ($O_3$), water ($H_2O$) and hydrogen peroxide ($H_2O_2$). As a result, the chemical adsorption layer and the oxide gas react with each other so as to form the metal oxide layer on the substrate. Then, the oxide gas remaining inside the reactor and gaseous byproducts produced by the reaction of the chemical adsorption layer and the oxide gas are exhausted to clean the inside of the reactor (step 17 of FIG. 1). In order to exhaust the oxide gas and the reaction byproducts, or to assist in such step, a purge gas may be supplied to the inside of the reactor. The purge gas normally comprises a substantially inert gas such as argon (Ar), helium (He), or nitrogen ($N_2$). A check is then performed, manually or automatically, to determine whether the metal oxide layer with a desired thickness has been formed or not. The metal oxide layer formation cycle 10 is repeatedly performed K times until the metal oxide layer having a desired thickness is formed on the substrate (step 19 of FIG. 1). Here, the number K is an integer in the range of 1 to about 10. That is, the number of repetitions K of the metal/oxide layer formation cycle 10 is preferably in the range of one time to ten times.

Next, a silicon oxide layer formation cycle 20 (comprising the separate, individual steps 21, 23, 25 and 27) is repeatedly performed Q times on the substrate having the metal oxide layer formed thereon. The silicon oxide layer formation cycle 20 may include the individual steps of supplying a silicon source gas (step 21 of FIG. 1), exhausting unreacted silicon source gas remaining in the reactor to clean the inside of the reactor (step 23 of FIG. 1), supplying an oxide gas into the reactor (step 25 of FIG. 1), and cleaning the inside of the reactor (step 27 of FIG. 1).

In specific, the silicon source gas is supplied into the reactor having the substrate loaded therein (step 21 of FIG. 1). In one embodiment, the silicon source gas is a material having the general chemical formula $Si_nX'_{2n+2}$, wherein n is a number ranging from about 1 to 4, and X' is a chemical group or element selected from the group consisting of NCO, F, Cl, Br and I. In another embodiment, the silicon source gas is a material having the general chemical formula $Si_nX'_{2n+2}O_{n-1}$, wherein n is a number ranging from about 2 to 5, and X' is a chemical group or element selected from the group consisting of NCO, F, Cl, Br and I. In still another embodiment, the silicon source gas may be a material having the general chemical formula $SiX''_n(NRR')_{4-n}$, wherein n may be a number ranging from about 0 to 3; X'' may be a chemical group or element selected from the group consisting of H, F, Cl, Br and I; R may be a chemical group or element selected from the group consisting of H, Me, Et and $^i$Pr; and R' may be a chemical group or element selected from the group consisting of H, Me, Et and $^i$Pr. In yet another embodiment of the present invention, the silicon source gas may be a material having the general chemical formula $NH_n(SiR''_3)_{3-n}$, wherein n may be a number ranging from about 0 to 2; N is nitrogen; and R'' may be a chemical group or element selected from the group consisting of H, F, Cl, Br, I, Me, Et and $^i$Pr. In still another embodiment of the present invention, the silicon source gas may be a material having the general chemical formula $SiSX_2$, wherein S is sulfur and X may be a chemical group or element selected from the group consisting of F, Cl, Br, and I. In still another specific embodiment of the present invention, the silicon source gas may be hexachlorodisilane (HCD) ($Si_2Cl_6$). Alternatively, the silicon source gas may be tris(dimethylamino)silane (TDMAS) ($[(CH_3)_2N]_3SiH$). As a result of the step of supplying the silicon source gas (step 21), a chemical adsorption layer including the silicon is formed on the surface of the substrate having the metal oxide layer formed thereon. After the chemical adsorption layer including the silicon is formed, the silicon source gas remaining in the reactor is exhausted to clean the inside of the reactor (step 23 of FIG. 1). In order to exhaust the silicon source gas, or to assist in such step, a purge gas may be supplied to the inside of the reactor. The purge gas normally comprises a substantially inert gas such as argon (Ar), helium (He), or nitrogen ($N_2$). Then, the oxide gas is supplied into the reactor (step 25 of FIG. 1). The oxide gas may be at least one member selected from the group consisting of oxygen ($O_2$), ozone ($O_3$), water ($H_2O$) and hydrogen peroxide ($H_2O_2$). For example, in the case that the silicon source gas is HCD, a preferred oxide gas may be $H_2O$. In the case that the silicon source gas is TDMAS, a preferred oxide gas may be ozone ($O_3$). As a result, the chemical adsorption layer and the oxide gas react with each other so as to form the silicon oxide layer on the substrate. Concurrently or at least substantially concurrently, the metal oxide layer and the silicon oxide gas react with each other so as to form the metal silicate layer. Then, the oxide gas remaining inside the reactor and gaseous byproducts produced by the reaction of the chemical adsorption layer and the oxide gas are exhausted to clean the inside of the reactor (step 27 of FIG. 1). In order to exhaust the oxide gas and the reaction byproducts, or to assist in such step, a purge gas may be supplied to the inside of the reactor. The purge gas normally comprises a substantially inert gas such as argon (Ar), helium (He), or nitrogen ($N_2$). A check is then performed, manually or automatically, to determine whether the metal silicate layer having a desired composition ratio has been formed or not. The silicon oxide layer formation cycle 20 is repeatedly performed Q times until the metal silicate layer having a desired composition ratio is formed on the substrate (step 29 of FIG. 1). Here, the number Q is an integer in the range of 1 to about 10. That is, the number of repetitions Q of the silicon/oxide layer formation cycle 20 is preferably in the range of one time to ten times.

In the method of fabricating a metal silicate layer according to preferred embodiments of the present invention, the numbers K and Q must be determined so as not to exceed 10 times respectively. For example, the number K may be in the range of 2 to 5, and the number Q may be 1. More preferably, the number K may be 3, and the number Q may be 1. If the K is 10 or more, the metal oxide layer formed by the metal oxide layer formation cycle 10 results in a very chemically stable structure. Formation of a metal oxide layer having such a chemically stable structure, however, makes it very difficult for the metal silicate layer to be formed during the silicon oxide layer formation cycle 20. That is, the silicon oxide layer may instead be separately stacked on the metal oxide layer having the chemically stable structure as above, and/or the silicon oxide layer formation reaction may not occur due to the metal oxide layer having the chemically stable structure. Further, if the number Q is 10 or more, the chemical adsorption layer including the silicon typically will not be formed even though the silicon source gas is further supplied to the metal silicate layer. That is, even if the silicon oxide layer formation cycle 20 is performed beyond 10 times, additional metal silicate layer generally is not further formed. The metal silicate layer formed in accordance with this invention may be represented by the general chemical formula $M_xSi_{1-x}O_2$ wherein: M may be an element selected from the group consisting of Hf, Zr and Ti, and "x" represents a composition ratio of the metal relative to metal+silicon. The "x" can be controlled to be in a range of about 0.10–0.95 by appropriately controlling the number of repeated cycles, K and Q respectively. More preferably, the "x" can be controlled to be in a range of about 0.65–0.85. That is, a metal silicate layer having a desired composition ratio "x" can be formed on the substrate by controlling the number K of metal/oxide cycles and the number Q of silicon/oxide cycles.

As a result, the metal silicate layer formation cycle includes an operation of performing the metal oxide layer formation cycle 10 K times and an operation of performing the silicon oxide layer formation cycle 20 Q times. Then, a thickness of the metal silicate layer is checked (step 39 of FIG. 1). The metal silicate layer formation cycle is performed at least one time, or is repeated until the metal silicate layer with a desired thickness is formed on the substrate. That is, until the metal silicate layer with a desired thickness is formed on the substrate, the sequence of operations of repeatedly performing the metal oxide layer formation cycle 10 K times, followed by repeatedly performing the silicon oxide layer formation cycle 20 Q times, is performed one or more times.

More specifically, a hafnium silicate ($Hf_xSi_{1-x}O_2$) layer can be formed according to embodiments of the present invention. Hereinafter, a method of fabricating the hafnium silicate ($Hf_xSi_{1-x}O_2$) layer according to embodiments of the present invention will be explained in reference to FIGS. 1 and 2.

The method of fabricating the hafnium silicate layer includes an initial or preliminary step of loading a suitable semiconductor substrate into a reactor section of ALD equipment (step 5 of FIG. 1).

The inside of the reactor is heated to a temperature suitable for performing the fabrication processes of this invention. For example, the appropriate temperature for the processes may be in the range of about 250° C. to 600° C.

A hafnium oxide layer formation cycle 10 is repeatedly performed on the substrate K times, thereby forming a hafnium (Hf) oxide layer with a desired thickness. The hafnium oxide layer formation cycle 10 may include the individual steps of supplying a hafnium (Hf) source gas (step 11 of FIG. 1), exhausting unreacted hafnium (Hf) source gas remaining in the reactor to clean the inside of the reactor (step 13 of FIG. 1), supplying an oxide gas into the reactor (step 15 of FIG. 1), and cleaning the inside of the reactor (step 17 of FIG. 1).

In specific, the hafnium (Hf) source gas is supplied into the reactor having the substrate loaded therein (step 11 of FIG. 1). In one embodiment, the hafnium (Hf) source gas is a material having the general chemical formula $HfX_4$, wherein X may be an element selected from the group consisting of F, Cl, Br and I. In another embodiment, the hafnium (Hf) source gas is a material having the general chemical formula $Hf(NRR')_4$, wherein R is a chemical group selected from the group consisting of H, Me, Et and $^iPr$, and R' is also a chemical group selected from the group consisting of H, Me, Et and $^iPr$. Further, the hafnium (Hf) source gas may also specifically be tetrakis(ethylmethylamino)hafnium (TEMAH) ($Hf[N(CH_3)C_2H_5]_4$). For example, in the case of supplying the TEMAH, the pulse time for supplying the TEMAH gas may be about 0.2~2 seconds. As a result, a chemical adsorption layer including the hafnium (Hf) is formed along exposed surface(s) of the substrate. After the chemical adsorption layer including the hafnium (Hf) is formed, the hafnium (Hf) source gas remaining in the reactor is exhausted to clean the inside of the reactor (step 13 of FIG. 1). In order to exhaust the hafnium (Hf) source gas, a purge gas may be supplied to the inside of the reactor. The purge gas normally comprises a substantially inert gas such as argon (Ar), helium (He), or nitrogen ($N_2$). Then, the oxide gas is supplied into the reactor (step 15 of FIG. 1). The oxide gas may be at least one member selected from the group consisting of oxygen ($O_2$), ozone ($O_3$), water ($H_2O$) and hydrogen peroxide ($H_2O_2$). In the case that the TEMAH is used for the hafnium (Hf) source gas, the oxide gas may advantageously be ozone ($O_3$). The ozone easily oxidizes typical impurities that may be stuck on the hafnium. That is, the ozone treatment is effective to remove impurities on the hafnium. As a result, the chemical adsorption layer and the oxide gas react with each other so as to form the hafnium (Hf) oxide layer on the substrate. Then, the oxide gas remaining inside the reactor and gaseous byproducts produced by the reaction of the chemical adsorption layer and the oxide gas are exhausted to clean the inside of the reactor (step 17 of FIG. 1). In order to exhaust the oxide gas and the reaction byproducts, a purge gas may be supplied to the inside of the reactor. The purge gas normally comprises a substantially inert gas such as argon (Ar), helium (He), or nitrogen ($N_2$). It is then checked whether the hafnium (Hf) oxide layer with a desired thickness has been formed or not. The hafnium (Hf) oxide layer formation cycle 10 is repeatedly performed K times until the hafnium (Hf) oxide layer having a desired thickness is formed on the substrate (step 19 of FIG. 1). Here, the number K is an integer in the range of 1 to about 10. That is, the number of repetitions K of the hafnium/oxide layer formation cycle 10 is preferably in the range of one time to ten times.

Next a silicon oxide layer formation cycle 20 is performed Q times on the substrate having the hafnium (Hf) oxide layer formed thereon, thereby forming a hafnium silicate layer. The silicon oxide layer formation cycle 20 may include the individual steps of supplying a silicon source gas (step 21 of FIG. 1), exhausting unreacted silicon source gas remaining in the reactor to clean the inside of the reactor (step 23 of FIG. 1), supplying an oxide gas into the reactor (step 25 of FIG. 1), and cleaning the inside of the reactor (step 27 of FIG. 1).

In specific, the hafnium silicate layer can be formed according to the embodiments of the present invention in the same general manner as the method explained in reference to FIGS. 1 and 2. For example, the silicon source gas may be hexachlorodisilane (HCD) ($Si_2Cl_6$). In the case that the silicon source gas is the HCD, the oxide gas may advantageously be $H_2O$. As a result, the hafnium (Hf) oxide layer and the silicon oxide layer react with each other so as to form the hafnium silicate layer. A check is then performed to determine whether the hafnium silicate layer having a desired composition ratio has been formed or not. The silicon oxide layer formation cycle 20 is repeatedly performed Q times until the hafnium silicate layer having a desired composition ratio is formed on the substrate (step 29 of FIG. 1). Here, the number Q is an integer in the range of 1 to about 10. That is, the number of repetitions Q of the silicon/oxide layer formation cycle 20 is preferably in the range of one time to ten times.

In the method of fabricating the hafnium silicate layer according to preferred embodiments of the present invention, the numbers K and Q must be determined or chosen so as not to exceed 10 times respectively. For example, the number K may be in the range of 2 to 5, and the number Q may be 1. More preferably, the number K may be 3, and the number Q may be 1. If the number K is 10 or more, the hafnium oxide layer formed by the hafnium oxide layer formation cycle 10 results in a very chemically stable structure. Formation of a hafnium oxide layer having such a chemically stable structure, however, makes it very difficult for the hafnium silicate layer to be formed during the silicon oxide layer formation cycle 20. That is, the silicon oxide layer may instead be separately stacked on the hafnium oxide layer having the chemically stable structure as above, and/or the silicon oxide layer formation reaction may not occur due to the hafnium oxide layer having the chemically stable structure. Further, if the number Q is 10 or more, the chemical adsorption layer including the silicon typically will not be formed on the hafnium silicate layer, even though the hexachlorodisilane (HCD) ($Si_2Cl_6$) gas is further supplied. That is, even if the silicon oxide layer formation cycle 20 is performed beyond 10 times, additional hafnium silicate layer generally is not further formed. The hafnium silicate layer formed in accordance with this invention may be represented by the general chemical formula $Hf_xSi_{1-x}O_2$ wherein "x" represents a composition ratio of hafnium (Hf) relative to hafnium+silicon. The "x" can be controlled to be in a range of about 0.10~0.95 by appropriately controlling the number of repeated cycles, K and Q respectively. More preferably, "x" can be controlled to be in a range of about 0.65~0.85. That is, a hafnium silicate ($Hf_xSi_{1-x}O_2$) layer having a desired composition ratio "x" can be formed on the substrate by controlling the number K of hafnium/oxide cycles and the number Q of silicon/oxide cycles.

As described in connection with the metal silicate layer formation cycle, the hafnium silicate layer formation cycle includes an operation of performing the hafnium oxide layer formation cycle 10 K times and an operation of performing the silicon oxide layer formation cycle 20 Q times. Then, a thickness of the hafnium silicate layer is checked (step 39 of FIG. 1). The hafnium silicate layer formation cycle is performed at least one time, or is repeated until the hafnium silicate layer with a desired thickness is formed on the substrate. That is, until the hafnium silicate layer with a desired thickness is formed on the substrate, the sequence of operations of repeatedly performing the hafnium oxide layer formation cycle 10 K times, followed by repeatedly performing the silicon oxide layer formation cycle 20 Q times, is performed one or more times.

Further, the present invention provides other, somewhat similar methods of fabricating the hafnium silicate ($Hf_xSi_{1-x}Q_2$) layer. Hereinafter, some of these other methods will be explained in reference to FIGS. 1 and 2.

In one such other method of fabricating the hafnium silicate layer, an initial or preliminary step comprises loading a suitable semiconductor substrate into a reactor section of ALD equipment (step 5 of FIG. 1).

The inside of the reactor is heated to a temperature suitable for performing the fabrication processes of this invention. For example, the appropriate temperature for the processes may be in the range of about 250° C. to 600° C.

A hafnium oxide layer formation cycle 10 is repeatedly performed on the substrate K times, thereby forming a hafnium (Hf) oxide layer with a desired thickness. The hafnium oxide layer formation cycle 10 may include the individual steps of supplying a hafnium (Hf) source gas (step 11 of FIG. 1), exhausting unreacted hafnium (Hf) source gas remaining in the reactor to clean the inside of the reactor (step 13 of FIG. 1), supplying an oxide gas into the reactor (step 15 of FIG. 1), and cleaning the inside of the reactor (step 17 of. FIG. 1).

In specific, the hafnium (Hf) source gas is supplied into the reactor having the substrate loaded therein (step 11 of FIG. 1). In one embodiment, the hafnium (Hf) source gas is a material having the general chemical formula $HfX_4$, wherein X may be an element selected from the group consisting of F, Cl, Br and I. In another embodiment, the hafnium (Hf) source gas is a material having the general chemical formula $Hf(NRR')_4$, wherein R is a chemical group selected from the group consisting of H, Me, Et and $^iPr$, and R' is also a chemical group selected from the group consisting of H, Me, Et and $^iPr$. Further, the hafnium (Hf) source gas may also specifically be tetrakis(ethylmethylamino)hafnium (TEMAH) ($Hf[N(CH_3)C_2H_5]_4$). For example, in the case of supplying the TEMAH, the pulse time for supplying the TEMAH gas may be about 0.2~2 seconds. As a result, a chemical adsorption layer including the hafnium (Hf) is formed along exposed surface(s) of the substrate. After the chemical adsorption layer including the hafnium (Hf) is formed, the hafnium (Hf) source gas remaining in the reactor is exhausted to clean the inside of the reactor (step 13 of FIG. 1). In order to exhaust the hafnium (Hf) source gas, a purge gas may be supplied to the inside of the reactor. The purge gas normally comprises a substantially inert gas such as argon (Ar), helium (He), or nitrogen ($N_2$). Then, the oxide gas is supplied into the reactor (step 15 of FIG. 1). The oxide gas may be at least one member selected from the group consisting of oxygen ($O_2$), ozone ($O_3$), water ($H_2O$) and hydrogen peroxide ($H_2O_2$). In the case that the TEMAH is used for the hafnium (Hf) source gas, the oxide gas may advantageously be ozone ($O_3$). The ozone easily oxidizes typical impurities that may be stuck on the hafnium. That is, the ozone treatment is effective to remove impurities on the hafnium. As a result, the chemical adsorption layer and the oxide gas react with each other so as to form the hafnium (Hf) oxide layer on the substrate. Then, the oxide gas remaining inside the reactor and gaseous byproducts produced by the reaction of the chemical adsorption layer and the oxide gas are exhausted to clean the inside of the reactor (step 17 of FIG. 1). In order to exhaust the oxide gas and the reaction byproducts, a purge gas may be supplied to the inside of the reactor. The purge gas normally comprises a substantially inert gas such as argon (Ar), helium (He), or nitrogen ($N_2$). It is then checked whether the hafnium (Hf) oxide layer with a desired thickness has been formed or not. The hafnium (Hf) oxide layer formation cycle 10 is repeatedly performed K times until the hafnium (Hf) oxide layer having a desired thickness is formed on the substrate (step 19 of FIG. 1). Here, the number K is an integer in the range of 1 to about 10. That is, the number of repetitions K of the hafnium/oxide layer formation cycle 10 is preferably in the range of one time to ten times.

Next a silicon oxide layer formation cycle 20 is performed Q times on the substrate having the hafnium (Hf) oxide layer formed thereon, thereby forming a hafnium silicate layer. The silicon oxide layer formation cycle 20 may include the individual steps of supplying a silicon source gas (step 21 of FIG. 1), exhausting unreacted silicon source gas remaining in the reactor to clean the inside of the reactor (step 23 of FIG. 1), supplying an oxide gas into the reactor (step 25 of FIG. 1), and cleaning the inside of the reactor (step 27 of FIG. 1).

In specific, the hafnium silicate layer can be formed according to the embodiments of the present invention in the same general manner as the method explained in reference to FIGS. 1 and 2. For example, the silicon source gas may use tris(dimethylamino)silane (TDMAS) ($[(CH_3)_2N]_3SiH$). In the case that the silicon source gas is the TDMAS, the oxide gas may advantageously be ozone ($O_3$). As a result, the hafnium (Hf) oxide layer and the silicon oxide layer react with each other so as to form the hafnium silicate layer. A check is then performed to determine whether the hafnium silicate layer having a desired composition ratio has been formed or not. The silicon oxide layer formation cycle 20 is repeatedly performed Q times until the hafnium silicate layer having a desired composition ratio is formed on the substrate (step 29 of FIG. 1). Here, the number Q is an integer in the range of 1 to about 10. That is, the number of repetitions Q of the silicon/oxide layer formation cycle 20 is preferably in the range of one time to ten times.

In the method of fabricating the hafnium silicate layer according to preferred embodiments of the present invention, the numbers K and Q must be determined or chosen so as not to exceed 10 times respectively. For example, the number K may be in the range of 1 to 3, and the number Q may be 1. More preferably, the number K may be 3, and the number Q may be 1. If the number K is 10 or more, the hafnium oxide layer formed by the hafnium oxide layer formation cycle 10 results in a very chemically stable structure. Formation of a hafnium oxide layer having such a chemically stable structure, however, makes it very difficult for the hafnium silicate layer to be formed during the silicon oxide layer formation cycle 20. That is, the silicon oxide layer may instead be separately stacked on the hafnium oxide layer having the chemically stable structure as above, and/or the silicon oxide layer formation reaction may not occur due to the hafnium oxide layer having the chemically stable structure. Further, if the number Q is 10 or more, the chemical adsorption layer including the silicon typically will not be formed on the hafnium silicate layer, even though the tris(dimethylamino) silane (TDMAS) ($[(CH_3)_2N]_3SiH$) gas is further supplied. That is, even if the silicon oxide layer formation cycle 20 is performed beyond 10 times, additional hafnium silicate layer generally is not further formed. The hafnium silicate layer formed in accordance with this invention may be represented by the general chemical formula $Hf_xSi_{1-x}O_2$ wherein "x" represents a composition ratio of hafnium (Hf) relative to hafnium+silicon. The "x" can be controlled to be in a range of about 0.10~0.95 by appropriately controlling the number of repeated cycles, K and Q respectively. More preferably, "x" can be controlled to be in a range of about 0.6~0.85. That is, a hafnium silicate ($Hf_xSi_{1-x}O_2$) layer having a desired composition ratio "x" can be formed on the substrate by controlling the number K of hafnium/oxide cycles and the number Q of silicon/oxide cycles.

As described in connection with the metal silicate layer formation cycle, the hafnium silicate layer formation cycle includes an operation of performing the hafnium oxide layer formation cycle 10 K times and an operation of performing the silicon oxide layer formation cycle 20 Q times. Then, a thickness of the hafnium silicate layer is checked (step 39 of FIG. 1). The hafnium silicate layer formation cycle is performed at least one time, or is repeated until the hafnium silicate layer with a desired thickness is formed on the substrate. That is, until the hafnium silicate layer with a desired thickness is formed on the substrate, the sequence of operations of repeatedly performing the hafnium oxide layer formation cycle 10 K times, followed by repeatedly performing the silicon oxide layer formation cycle 20 Q times, is performed at least one or more times.

EXPERIMENT EXAMPLES

Figure 3:
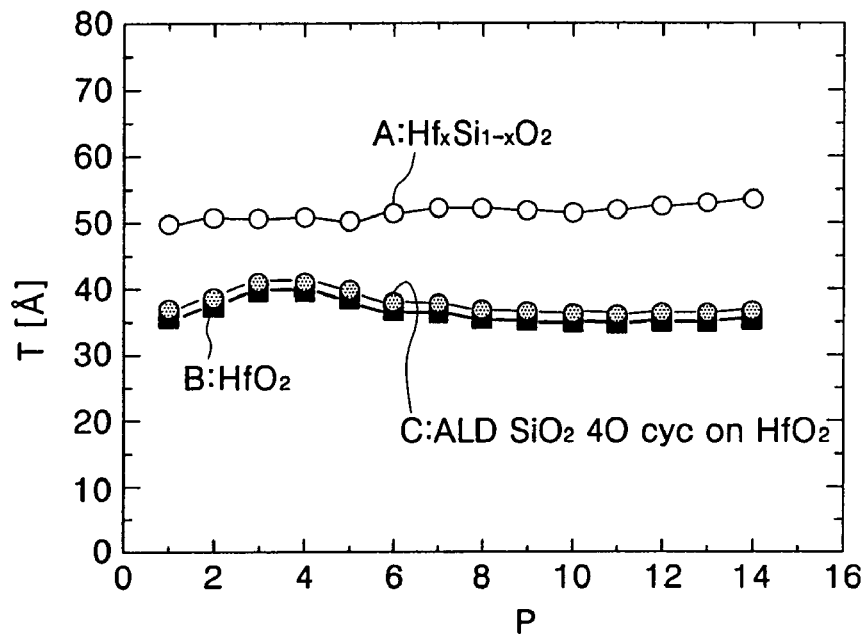
FIG. 3 is a graph illustrating the thicknesses of different hafnium silicate layers formed on a semiconductor substrate according to embodiments of the present invention plotted against spaced measured positions along the semiconductor substrate.

FIG. 3 is a graph illustrating thicknesses of different hafnium silicate layers formed on a semiconductor substrate according to embodiments of the present invention. A horizontal axis P in the graph of FIG. 3 represents measured positions of the semiconductor substrate, and the measured positions are spaced by 7 mm downward from the center of the semiconductor substrate. A vertical axis T in the graph of FIG. 3 represents measured thickness, and the unit of thickness is Å. In the three experiment examples shown in FIG. 3, the same temperature of the reactor, deposition pressure, and pulse time of supplying the hafnium source gas, among the various process conditions for forming the hafnium silicate layer, were used for comparison. In specific, the temperature of the reactor was set at 320° C., and the deposition pressure was set at 0.2 torr. Further, the pulse time of supplying the hafnium source gas was 0.2 seconds.

Referring to FIG. 3, a curve A shows the result of the experiment in which K was set to be 1, Q was set to be 3, and the hafnium silicate layer formation cycle was repeatedly performed 40 times as described previously in reference to FIGS. 1 and 2. Further, the hafnium source gas used in the hafnium oxide layer formation cycle 10 was TEMAH, and the oxide gas was ozone. Further, the silicon source gas used in the silicon oxide layer formation cycle 20 was HCD, and the oxide gas was $H_2O$. As a result, the hafnium silicate ($Hf_xSi_{1-x}O_2$) layer was formed having a thickness of about 50 Å as shown by the curve A in FIG. 3.

Curve B in FIG. 3 shows the result of the experiment in which K was set to be 40, that is, only the hafnium oxide layer formation cycle 10 was performed 40 times as described in reference to FIGS. 1 and 2. The curve B shows the result of measured thickness of the hafnium oxide ($HfO_2$) layer formed as above. Further, the hafnium source gas used was TEMAH, and the oxide gas was ozone. As a result, the hafnium oxide ($HfO_2$) layer was formed with a thickness of about 38 Å as shown in the curve B.

Curve C in FIG. 3 shows the result of the experiment in which K was set to be 40, that is, the hafnium oxide layer formation cycle 10 was performed 40 times to form a hafnium oxide ($HfO_2$) layer, and then, Q was also set to be 40, that is, the silicon oxide layer formation cycle 20 was performed 40 times to form the silicon oxide layer on the semiconductor substrate having the hafnium oxide ($HfO_2$) layer. The curve C shows the result of measured thickness of the thin film formed by performing the foregoing formation processes. Further, the hafnium source gas used in the hafnium oxide layer formation cycle 10 was TEMAH, and the oxide gas was ozone. Further, the silicon source gas used in the silicon oxide layer formation cycle 20 was HCD, and the oxide gas was $H_2O$. As a result, any further thin film was not formed on the hafnium oxide ($HfO_2$) layer with a thickness of 38 Å as shown by the curve C. That is, in the case that the number K is 40 as described above, even though the silicon oxide layer formation cycle 20 is additionally performed, additional thickness is not added to the hafnium silicate layer.

According to the results of the experiment examples shown in FIG. 3, a hafnium silicate layer with a predetermined thickness can best be formed by appropriately controlling the number of repetition cycles, that is, the numbers K and Q, to about 10 or less.

Figure 4:
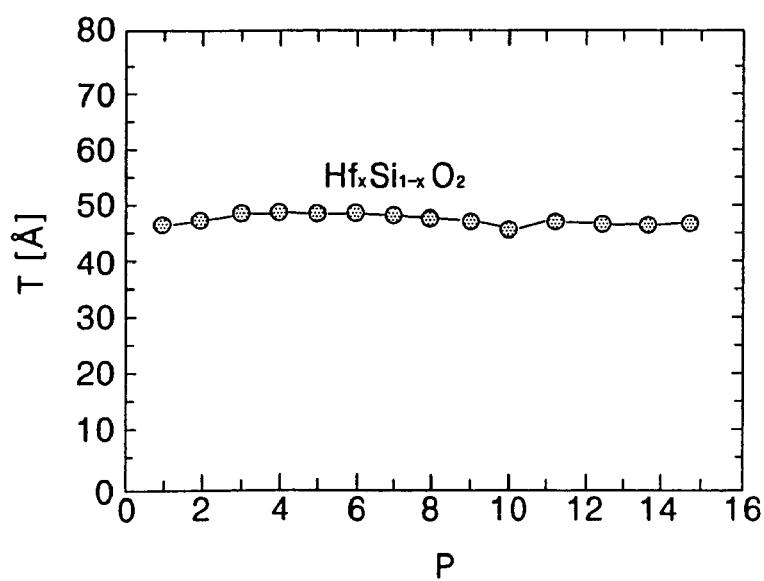
FIGS. 4 through 6 are graphs illustrating comparisons of thicknesses of several metal silicate layers varied in accordance with injection time of a metal source gas, according to the present invention.
Figure 5:
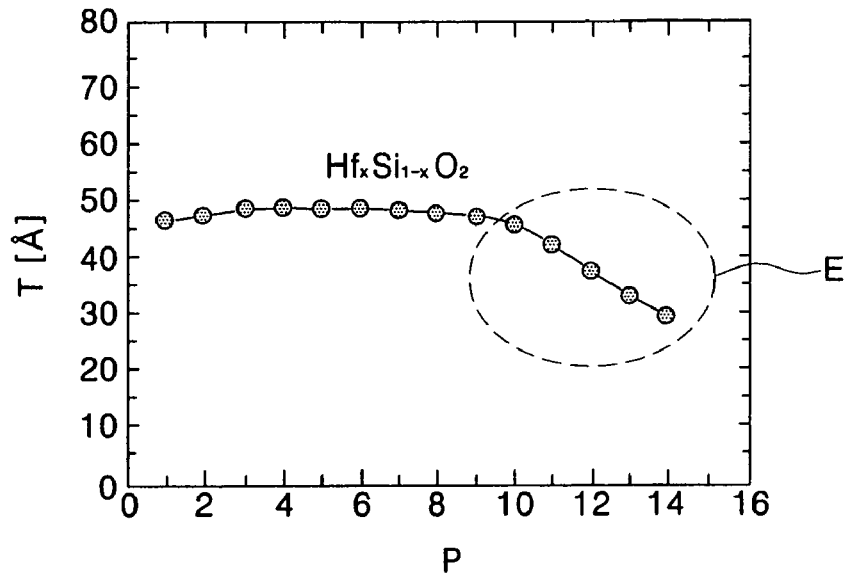
Figure 6:
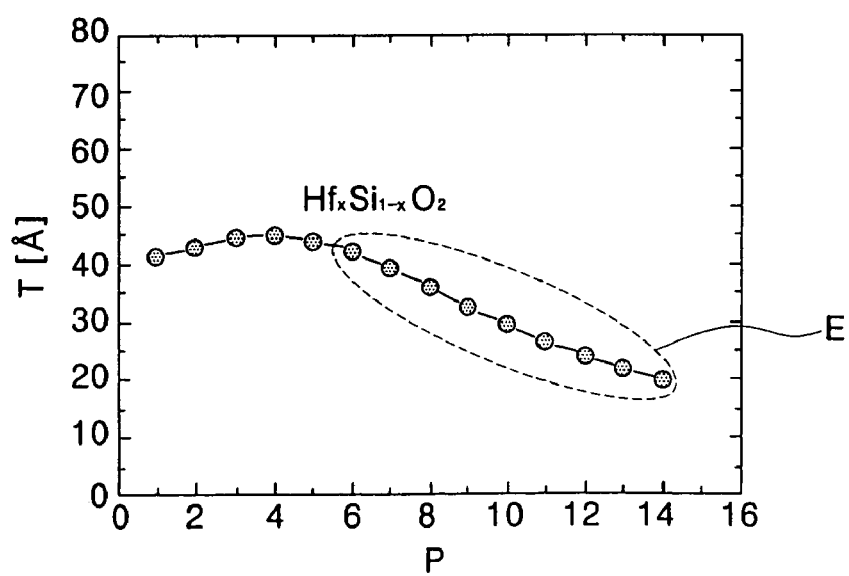

FIGS. 4 through 6 are graphs illustrating comparisons of thicknesses of several metal silicate layers varied in accordance with injection time of a metal source gas, according to the present invention. In FIGS. 4 through 6, a pulse time of supplying the hafnium source gas to the reactor is made to be varied. As described above, the hafnium silicate layer formation cycle includes an operation of performing the hafnium oxide layer formation cycle 10 K times and an operation of performing the silicon oxide layer formation cycle 20 Q times. The hafnium source gas used in the hafnium oxide layer formation cycle 10 was TEMAH, and the oxide gas was ozone. Further, the silicon source gas used in the silicon oxide layer formation cycle 20 was HCD, and the oxide gas was $H_2O$.

FIG. 4 is a graph illustrating a thickness distribution of the hafnium silicate layer formed when the pulse time for supplying the TEMAH is 0.2 seconds. In FIG. 4, the thickness of the hafnium silicate layer at both the center and the bottom of the semiconductor substrate is substantially the same; that is, this example shows a substantially uniform hafnium silicate layer thickness of about 46 Å.

FIG. 5 is a graph illustrating a thickness distribution of the hafnium silicate layer formed when the pulse time for supplying the TEMAH is 0.1 seconds. Unlike the results of FIG. 4, the thickness of the hafnium silicate layer at the center of the semiconductor substrate is almost uniform, but then decreases markedly toward the bottom of the semiconductor substrate. Particularly, the thickness of the hafnium silicate layer rapidly decreases in the region of the graph denoted by the letter (E), which is located about 70 mm from the center of the semiconductor substrate.

FIG. 6 is a graph illustrating a thickness distribution of the hafnium silicate layer formed when the pulse time for supplying the TEMAH is 0.05 seconds. While the thickness of the hafnium silicate layer is somewhat uniform at the center of the semiconductor substrate, it decreases rapidly and substantially toward the bottom of the semiconductor substrate. Particularly, the thickness of the hafnium silicate layer rapidly decreases in the region of the graph denoted by the letter (E), which is located about 42 mm from the center of the semiconductor substrate. An explanation for these results is believed to be that the TEMAH cannot be adequately supplied to the bottom of the semiconductor substrate because the pulse time for supplying the TEMAH is too short.

As shown from the results of FIGS. 4 to 6, the pulse time for supplying the TEMAH in these examples is preferably set to be about 0.2 seconds or more. For example, the pulse time for supplying the TEMAH may be set within a range of about 0.2 to 2 seconds.

Figure 7:
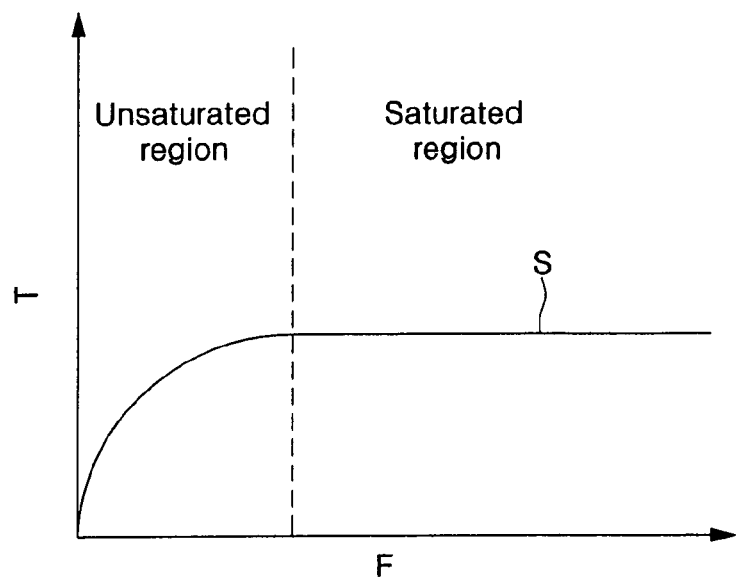
FIG. 7 is a graph illustrating how deposition thickness varies in accordance with an injection amount of a metal source gas and a silicon source gas during the formation of a metal silicate layer according to the present invention.

FIG. 7 is a graph illustrating how deposition thickness varies in accordance with an injection amount of a metal source gas and a silicon source gas during the formation of a metal silicate layer according to the present invention. In the graph of FIG. 7, a horizontal axis F represents an injection amount of a source gas, and a vertical axis T represents a deposition thickness.

Referring to FIG. 7, the variation in the thickness of the metal silicate layer formed in accordance with increases in the injection amount of the source gases is shown as a curve S. In specific, the curve S has an unsaturated region in which the thickness of the metal silicate layer formed on the substrate increases as the supply amount of the source gases is increased. Further, the curve S also has a saturated region where the thickness of the metal silicate layer formed on the substrate plateaus and does not further increase as the injection amount of the source gases is further increased. Therefore, the deposition thickness of a metal silicate layer formed in accordance with this invention can be controlled by appropriately controlling the supply amount of the source gas, at least in the unsaturated region of the curve S, thereby also controlling the composition ratio of the metal silicate layer.

For example, in order to form a metal silicate layer having a high composition ratio of a metal element, the metal source gas is supplied in an amount that would be located in the saturated region of the curve S (representing the maximum amount of the metal that can be incorporated into the metal silicate layer), and the silicon source gas is supplied in the unsaturated region of the curve S (representing something less than the maximum amount of silicon that could potentially be incorporated into the metal silicate layer). On the contrary, in order to form a metal silicate layer having a high composition ratio of a silicon element, the metal source gas would be supplied in an amount that would be located in the unsaturated region of the curve S (less than maximum metal), and the silicon source gas would be supplied in an amount that would be located in the saturated region of the curve S (maximum silicon).

FIGS. 8 through 11 are graphs illustrating X-ray photoelectron spectroscopy (XPS) analysis results of a hafnium silicate ($Hf_xSi_{1-x}O_2$) layer deposited according to the present invention. A horizontal axis M of FIGS. 8 to 11 represents a sputter time of the XPS, in which the unit of scale is in minutes, and a vertical axis A represents an atomic concentration, in which the unit is percent (%).

Among the various process conditions for forming the hafnium silicate layer, for the examples of FIGS. 8 to 11 a temperature of the reactor and a deposition pressure were set to be 320° C. and 0.2 torr respectively. The hafnium source gas used in the hafnium oxide layer formation cycle 10 was TEMAH, and the oxide gas was ozone. Further, the silicon source gas used in the silicon oxide layer formation cycle 20 was HCD, and the oxide gas was $H_2O$. The complete hafnium silicate layer formation cycles in FIGS. 8 to 11 were performed 80 times respectively. As described above, each complete hafnium silicate layer formation process includes an operation of performing the hafnium oxide layer formation cycle 10 K times and an operation of performing the silicon oxide layer formation cycle 20 Q times. The K and the Q are set at different values in the cases of FIGS. 8 to 11.

In order to remove a possibility of surface contamination in the samples, which may occur during the XPS analysis, the measurement results provided during the period between 2 minutes after sputter starts through the 14 minute point of the analysis are treated as part of an "effective period" D, and these results are used to analyze the composition ratio of the hafnium silicate ($Hf_xSi_{1-x}O_2$) layer. During the effective period D, the composition ratios of two common surface contaminants, carbon (C) and chlorine (Cl), are shown as being 0.5% or less as shown in FIGS. 8 to 11.

Figure 8:
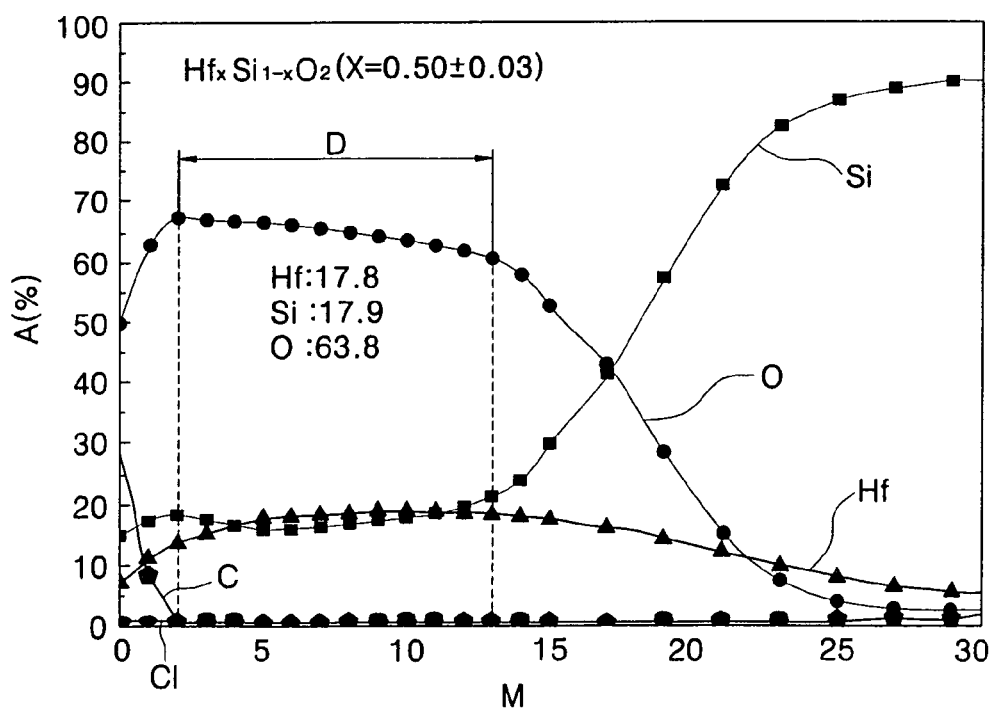
FIGS. 8 through 11 are graphs illustrating X-ray photoelectron spectroscopy (XPS) analysis results of different hafnium silicate ($Hf_xSi_{1-x}O_2$) layers, representing differing composition ratios ("x"), deposited according to the present invention.

FIG. 8 shows XPS analysis results of a hafnium silicate ($Hf_xSi_{1-x}O_2$) layer formed whereby K=1 and Q=3. Based on the effective period D, the hafnium silicate ($Hf_xSi_{1-x}O_2$) layer formed shows a composition in which Hf=17.8, Si=17.9, and O=63.8. The composition ratio "x" of the hafnium relative to hafnium+silicon in this hafnium silicate layer is 0.50±0.03.

Figure 9:
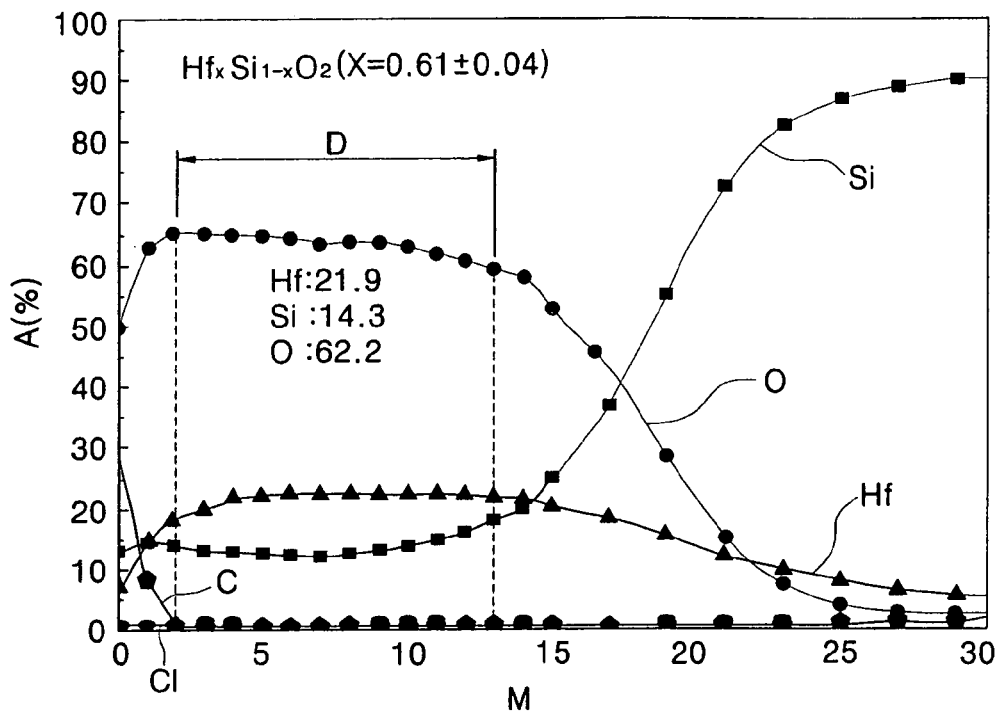

FIG. 9 shows XPS analysis results of a hafnium silicate ($Hf_xSi_{1-x}O_2$) layer formed wherein K=1 and Q=1. Based on the effective period D, the hafnium silicate ($Hf_xSi_{1-x}O_2$) layer formed shows a composition in which Hf=21.9, Si=14.3, and O=62.2. The composition ratio "x" of the hafnium relative to hafnium+silicon in this hafnium silicate layer is 0.61±0.04.

Figure 10:
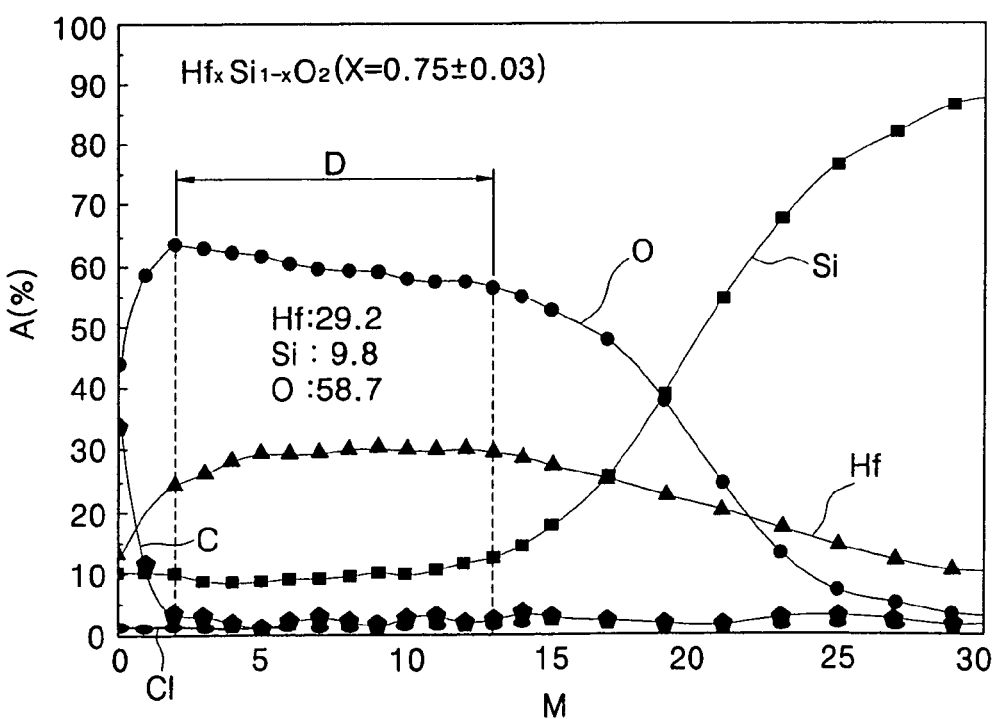

FIG. 10 shows XPS analysis results of a hafnium silicate ($Hf_xSi_{1-x}O_2$) layer formed wherein K=3 and Q=1. Based on the effective period D, the hafnium silicate ($Hf_xSi_{1-x}O_2$) layer formed shows a composition in which Hf=29.2, Si=9.8, and O=58.7. The composition ratio "x" of the hafnium relative to hafnium+silicon in this hafnium silicate layer is 0.75±0.03.

Figure 11:
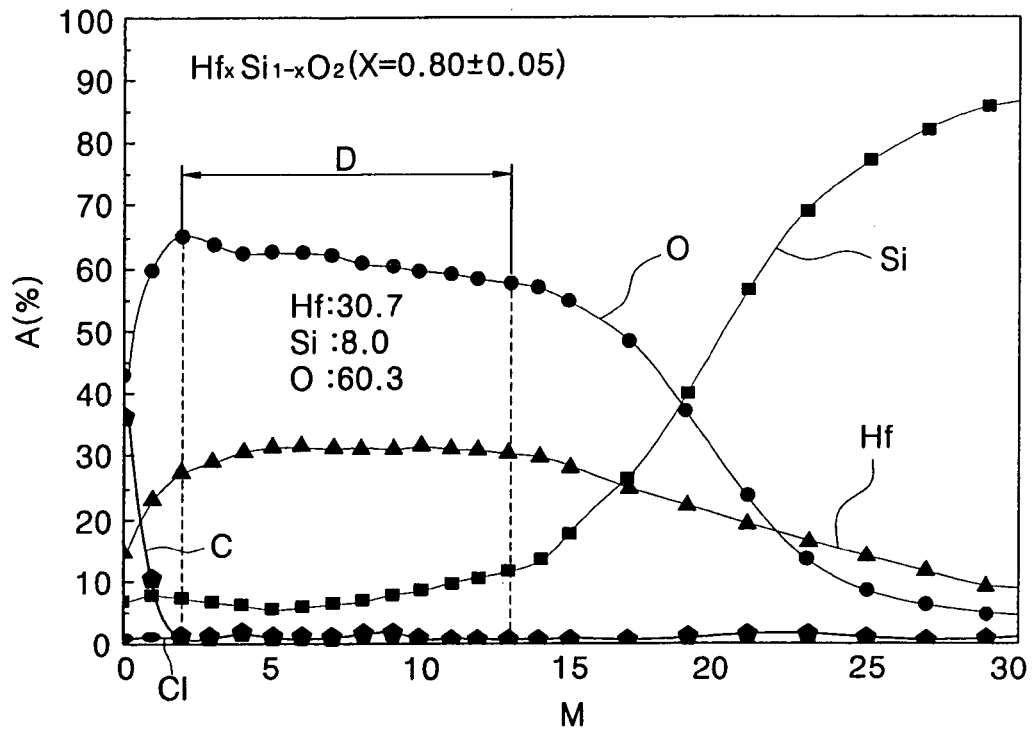

FIG. 11 shows XPS analysis results of a hafnium silicate ($Hf_xSi_{1-x}O_2$) layer formed wherein K=5 and Q=1. Based on the effective period D, the hafnium silicate ($Hf_xSi_{1-x}O_2$) layer formed shows a composition in which Hf=30.7, Si=8.0, and O=60.3. The composition ratio "x" of the hafnium relative to hafnium+silicon in this hafnium silicate layer is 0.80±0.05.

From the foregoing XPS analysis results, the composition ratio of hafnium relative to hafnium+silicon in the hafnium silicate layer can be controlled by appropriately controlling the K and the Q values during the hafnium silicate layer formation process of FIGS. 1 and 2. It has been found that, if the composition ratio of the metal element, hafnium (Hf), is relatively high, a dielectric constant of the layer is increased, but a mobility of carriers is decreased. On the contrary, it has been found that, if the composition ratio of the metal element, hafnium (Hf), relative to the silicon element is low, the mobility of carriers in the layer is increased, but the dielectric constant is decreased. Therefore, if the K and the Q values are appropriately controlled, the properties of the resulting dielectric layer can be optimized for particular applications.

Figure 12:
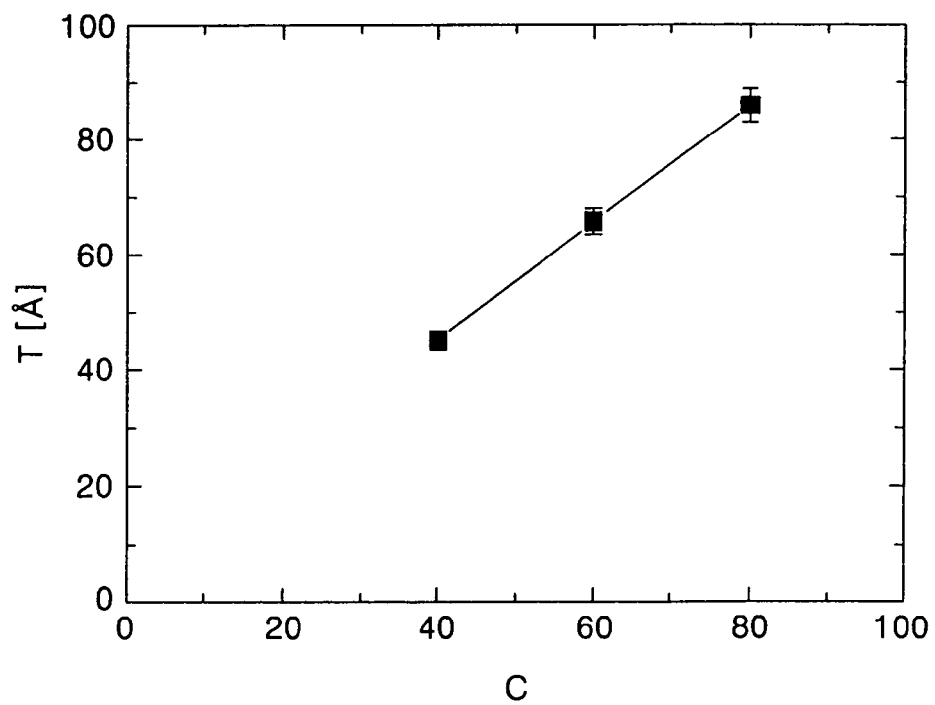
FIG. 12 is a graph illustrating the variation in thickness of a hafnium silicate layer in accordance with variations in the number of formation cycles according to the present invention.

FIG. 12 is a graph illustrating how the thickness of a hafnium silicate layer increases in accordance with the number of repeated formation cycles according to the present invention. A horizontal axis C in the graph of FIG. 12 represents the number of repeated cycles of the hafnium silicate formation cycle, and a vertical axis T represents the measured thickness of the resulting hafnium silicate layer. The hafnium source gas used in the hafnium oxide layer formation cycle 10 for this example was TEMAH, the oxide gas was ozone, and K was 1. Further, the silicon source gas used in the silicon oxide layer formation cycle 20 was HCD, the oxide gas was $H_2O$, and Q was 3.

Referring to FIG. 12, the curve of the thickness of the hafnium silicate layer plotted against the number of formation cycles is seen to linearly increase in accordance with the increase of the number of repeated hafnium silicate layer formation cycles, and the relevant linear equation can be determined as follows: T=4.635+1.01797C. That is, the thickness of the hafnium silicate layer can be controlled precisely by controlling the number of the repeated hafnium silicate layer formation cycles. It will be understood by those skilled in the art that somewhat different linear equations can be determined to relate layer thickness to the number of formation cycles for different combinations of process parameters used in practicing this invention.

Figure 13:
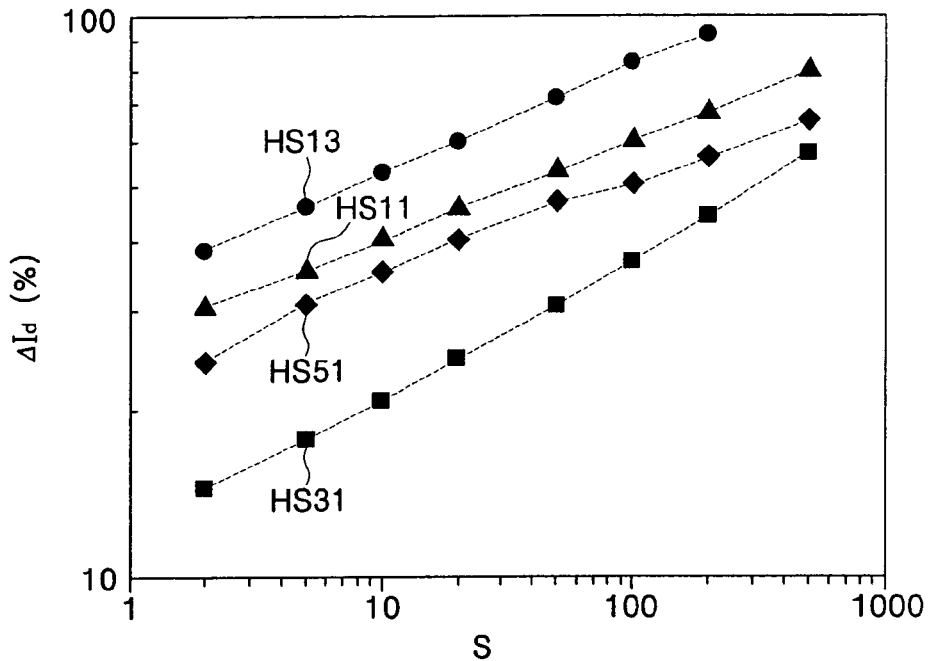
FIG. 13 is a graph illustrating different drain current deterioration characteristics of drain current for different hafnium silicate layers according to experiment examples of the present invention.

FIG. 13 is a graph illustrating the varying deterioration characteristics of drain current when different hafnium silicate layers formed according to the present invention are applied to MOS transistors. A horizontal axis S in the graph of FIG. 13 represents a stress time applied to the MOS transistor scaled in time units of seconds. A vertical axis ($\Delta I_d$) in the graph of FIG. 13 represents a deterioration rate of drain current, scaled in percent (%). The deterioration rate of drain current can be calculated as a rate of the difference between an initial drain saturation current and a drain saturation current after a certain stress time relative to the initial drain saturation current.

The MOS transistors used in the experiments of the present invention were fabricated using a pattern with a width W of 10 um and a length L of 0.13 um. Further, the gate dielectric layers of the several MOS transistors were formed of different hafnium silicate layers, each with a thickness of 30 Å. As described in reference to FIGS. 1 and 2, each complete hafnium silicate layer formation cycle included an operation of performing the hafnium oxide layer formation cycle 10 K times and an operation of performing the silicon oxide layer formation cycle 20 Q times. Further, the hafnium source gas used in the hafnium oxide layer formation cycle 10 was TEMAH, and the oxide gas was ozone. Further, the silicon source gas used in the silicon oxide layer formation cycle 20 was HCD, and the oxide gas was $H_2O$. The K and the Q values for each gate dielectric layer were set differently.

As for the bias conditions applied to the MOS transistors in the experiment examples of the present invention, a gate voltage Vg was 3.0 V and a drain potential difference Vd was 3.0 V.

Referring to FIG. 13, a curve HS31 shows the deterioration characteristics of drain current relative to a hafnium silicate layer formed under conditions of K=3 and Q=1. Similarly, a curve HS51 shows the deterioration characteristics of drain current relative to a hafnium silicate layer formed under conditions of K=5 and Q=1. A curve HS11 shows the deterioration characteristics of drain current relative to a hafnium silicate layer formed under conditions of K=1 and Q=1, and a curve HS13 represents a hafnium silicate layer formed under conditions of K=1 and Q=3.

As shown in FIG. 13, all of the experiment examples according to the present invention show excellent deterioration characteristics of drain current. Particularly, it can be seen that the deterioration characteristics of drain current of the hafnium. silicate layer represented by the curve HS31 (K=3, Q=1) is the most excellent compared with the results of the hafnium silicate layers represented by the other curves. Referring to the XPS analysis results of FIG. 10, the hafnium silicate ($Hf_xSi_{1-x}O_2$) layer formed by setting K=3, and Q=1 has a composition ratio "x" of the hafnium relative to hafnium+silicon of 0.75±0.03. That is, the hafnium silicate ($Hf_xSi_{1-x}O_2$) layer having a composition ratio "x"=0.75±0.03 shows relatively more superior deterioration characteristics of drain current in comparison with the hafnium silicate layers having other composition ratios.

Figure 14:
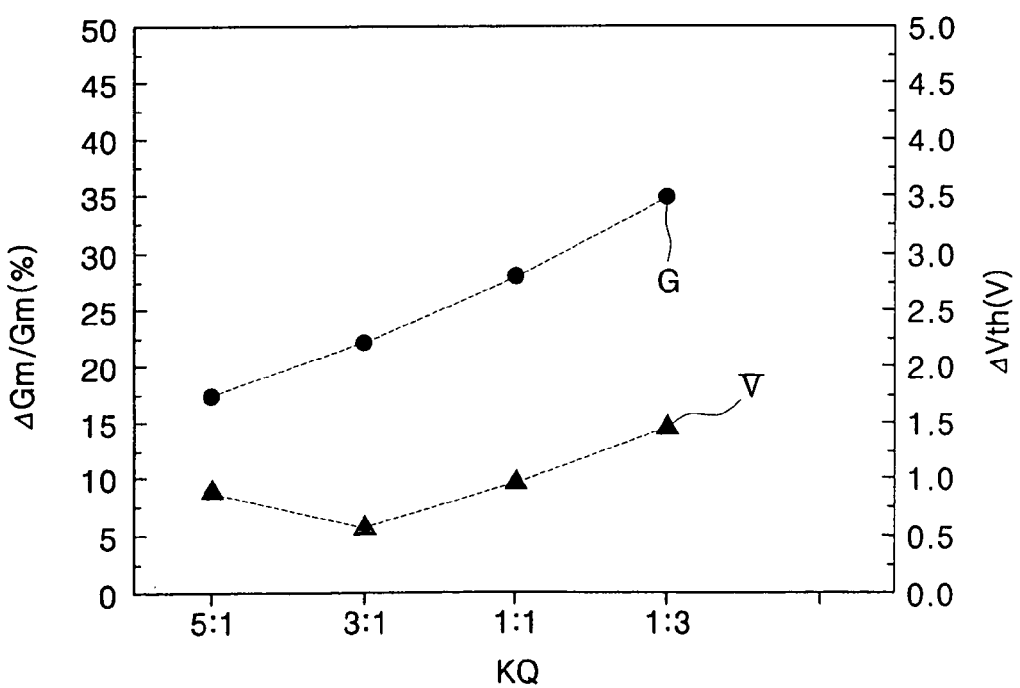
FIG. 14 is a graph illustrating different deterioration characteristics of transconductance (Gm) and threshold voltage (Vth) for different hafnium silicate layers according to experiment examples of the present invention.

FIG. 14 is a graph illustrating the varying deterioration characteristics of transconductance (Gm) and threshold voltage (Vth) according to different experiment examples of the present invention. In the graph of FIG. 14, a horizontal axis (KQ) represents different K:Q ratios used in the hafnium silicate layer formation cycle. For example, the point of the horizontal axis (KQ), 5:1 means that K=5 and Q=1. In the graph of FIG. 14, a first (left-side) vertical axis ($\Delta Gm/Gm$) represents a deterioration rate of transconductance scaled in percent (%). The deterioration rate of transconductance can be calculated as a rate of the difference between an initial transconductance and a transconductance after a stress time of 1000 seconds relative to the initial transconductance. The transconductance is linearly proportional to the mobility of carriers in the dielectric layer. In the graph of FIG. 14, a second (right-side) vertical axis ($\Delta Vth$) represents a threshold voltage difference scaled in volts (V). The threshold voltage difference can be calculated as a difference between an initial threshold voltage and a threshold voltage measured after a stress time of 1000 seconds.

The MOS transistors used in the experiment examples of the present invention were fabricated under substantially same process conditions as those of FIG. 13, as described above. Further, as for the bias conditions applied to the MOS transistors in the experiment examples of the present invention, a gate voltage Vg was 3.0 V and a drain potential difference Vd was 3.0 V.

The curve G of FIG. 14 represents characteristics of deterioration of transconductance. Referring to the data points along the curve G and the associated points of the horizontal axis KQ, it can be seen that the most desirable deterioration characteristics of transconductance results from the hafnium silicate layer formed by setting K=5 and Q=1, as compared with the other examples.

The curve V of FIG. 14 represents characteristics of deterioration of threshold voltage. Referring to the data points along of the curve V and the associated points of the horizontal axis KQ, it can be seen that the most desirable deterioration characteristics of threshold voltage results from the hafnium silicate layer formed by setting K=3 and Q=1, as compared with the other examples.

Figure 15:
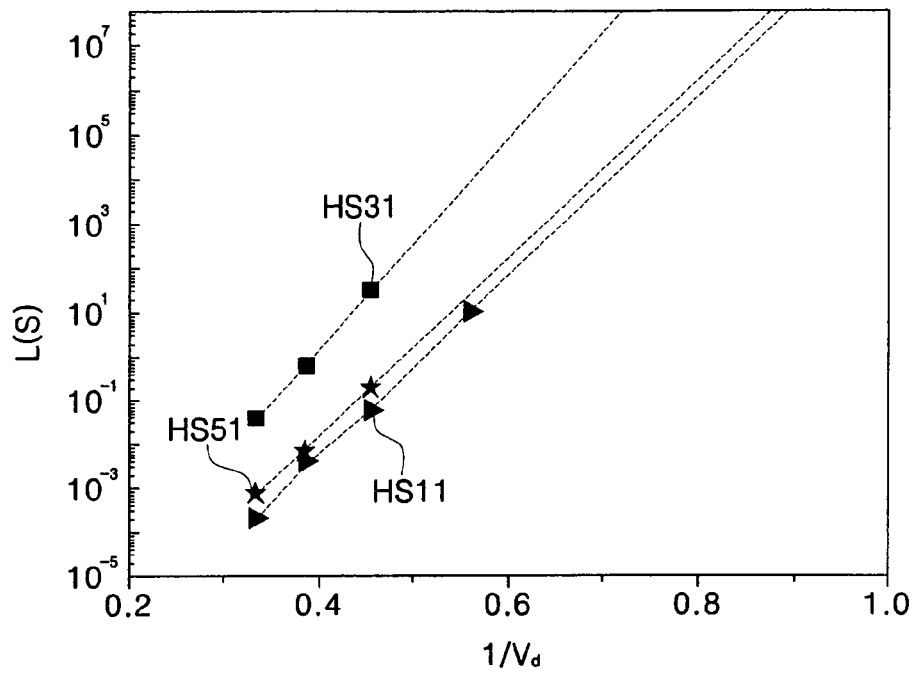
FIG. 15 is a graph illustrating different lifetime characteristics of hot carrier injection (HCl) for different hafnium silicate layers according to experiment examples of the present invention.

FIG. 15 is a graph illustrating the differing lifetime characteristics of hot carrier injection (HCI) achieved when different hafnium silicate layers formed according to the present invention are employed in fabricating different MOS transistors. A horizontal axis (1/Vd) in the graph of FIG. 15 represents an inverse number of a drain potential difference of the MOS transistor. A vertical axis (L) in the graph of FIG. 15 represents a lifetime scaled in seconds (sec.).

The MOS transistors used in the experiment examples of the present invention were fabricated under the substantially same fabrication process conditions as those of FIG. 13, as described above. Further, in the experiment examples of the present invention, a gate voltage Vg applied to the MOS transistors was 3.0 V.

Referring to FIG. 15, a curve HS31 shows lifetime characteristics of hot carrier injection (HCI) relative to a hafnium silicate layer formed under conditions of K=3 and Q=1. Similarly, a curve HS51 shows HCI lifetime characteristics relative to a hafnium silicate layer formed under conditions of K=5 and Q=1. A curve HS11 shows HCI lifetime characteristics relative to a hafnium silicate layer formed under conditions of K=1 and Q=1.

As shown in FIG. 15, all of the experiment examples of the present invention showed excellent HCI lifetime characteristics. Particularly, the HCI lifetime characteristics of the hafnium silicate layer represented by the curve HS31 (K=3, Q=1) demonstrated the most excellent such characteristics compared with the other curves. Referring to the XPS analysis results of FIG. 10, the hafnium silicate ($Hf_xSi_{1-x}O_2$) layer formed under the conditions of K=3 and Q=1 is formed such that a composition ratio "x" of hafnium relative to hafnium+ silicon is in the range of 0.75±0.03. That is, the hafnium silicate ($Hf_xSi_{1-x}O_2$) layer having a composition ratio "x"=0.75±0.03 shows superior HCI lifetime characteristics in comparison with those of the hafnium silicate layers having different composition ratios.

Figure 16:
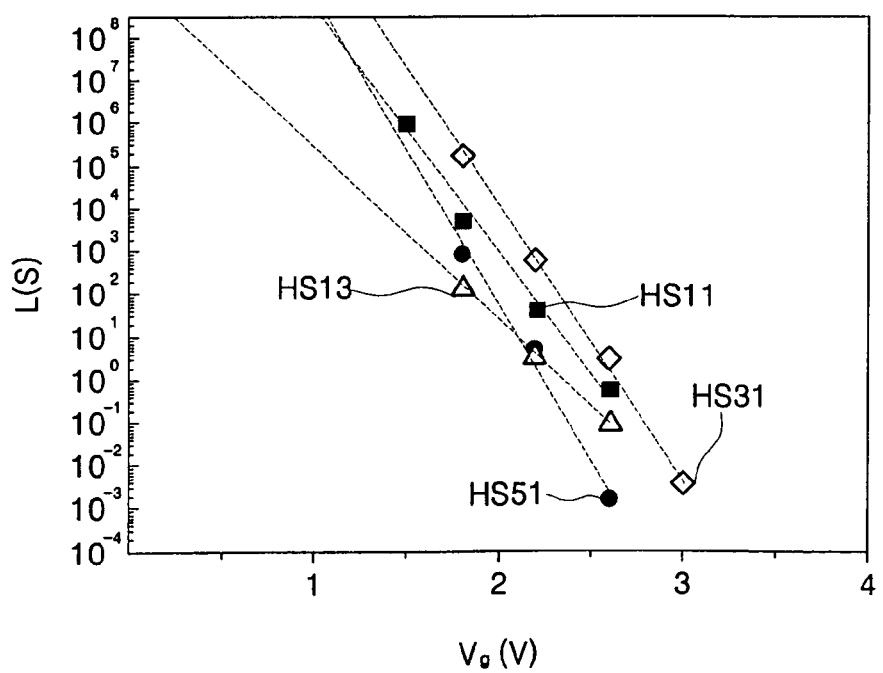
FIG. 16 is a graph illustrating different lifetime characteristics of positive bias temperature instability (PBTI) for different hafnium silicate layers according to experiment examples of the present invention.

FIG. 16 is a graph illustrating the differing lifetime characteristics of positive bias temperature instability (PBTI) demonstrated by different experiment examples of the present_invention. A horizontal axis (Vg) in the graph of FIG. 16 represents a gate voltage of an nMOS transistor scaled in volts (V). A vertical axis (L) in the graph of FIG. 16 represents a lifetime scaled in seconds (sec.).

The nMOS transistors used in the experiments of the present invention were fabricated using a pattern with a width W of 10 um and a length L of 1 um. Further, the gate dielectric layers of the several nMOS transistors were formed of different hafnium silicate layers, each with a thickness of 30 Å. As described in reference to FIGS. 1 and 2, each complete hafnium silicate layer formation cycle included an operation of performing the hafnium oxide layer formation cycle 10 K times and an operation of performing the silicon oxide layer formation cycle 20 Q times. Further, the hafnium source gas used in the hafnium oxide layer formation cycle 10 was TEMAH, and the oxide gas was ozone. Further, the silicon source gas used in the silicon oxide layer formation cycle 20 was HCD, and the oxide gas was $H_2O$. The K and the Q values for each gate dielectric layer were set differently.

In the experiment examples of the present invention, a drain potential difference Vd applied to the nMOS transistors was set to be the same, namely 50 mV. Further, a temperature of positive bias temperature instability (PBTI) conditions was 125° C.

Referring to FIG. 16, a curve HS31 shows PBTI lifetime characteristics relative to a hafnium silicate layer formed under the conditions of K=3, Q=1. Similarly, a curve HS51 shows PBTI lifetime characteristics relative to a hafnium silicate layer formed under the conditions of K=5, Q=1. A curve HS11 shows PBTI lifetime characteristics relative to a hafnium silicate layer formed under the conditions of K=1, Q=1; and, a curve HS13 shows PBTI lifetime characteristics relative to a hafnium silicate layer formed under the conditions of K=1, Q=3.

As shown in FIG. 16, all of the experiment examples of the present invention showed excellent PBTI lifetime characteristics. Particularly, the PBTI lifetime characteristics of the hafnium silicate layer represented by the curve HS31 (K=3, Q=1) demonstrated the most excellent such characteristics compared with the other curves. Referring to the XPS analysis results of FIG. 10, the hafnium silicate ($Hf_xSi_{1-x}O_2$) layer formed under the conditions of K=3 and Q=1 is formed such that a composition ratio "x" of hafnium relative to hafnium+ silicon is in the range of 0.75±0.03. That is, the hafnium silicate ($Hf_xSi_{1-x}O_2$) layer having a composition ratio "x"=0.75±0.03 shows superior PBTI lifetime characteristics in comparison with those of the hafnium silicate layers having different composition ratios.

According to the present invention as described above, a complete metal silicate layer formation cycle includes an operation of performing the metal oxide layer formation cycle K times and an operation of performing the silicon oxide layer formation cycle Q times. The K and the Q numbers are integers that may range from 1 to 10. Composition ratios of metal relative to silicon in the metal silicate layer can be controlled by appropriately controlling the number of repeated cycles, K and Q respectively, in each metal silicate layer formation cycle. Further, the thickness of a metal silicate layer can be precisely controlled by appropriately controlling the number of repeated metal silicate layer formation cycles. Therefore, a metal silicate layer having a desired composition ratio and a uniform desired thickness can be fabricated using an ALD technique according to this invention.

What is claimed is:

1. A method of fabricating a metal silicate layer on a substrate using an atomic layer deposition technique, said method comprising the sequential steps of:
   (a) loading a substrate into a reactor;
   (b) supplying a metal source gas containing a desired metal into the reactor having the substrate under reaction conditions to form a first chemical adsorption layer including the desired metal on the substrate;
   (c) after completion of step (b), supplying a first oxide gas into the reactor under reaction conditions to react with the first chemical adsorption layer including the desired metal to form a metal oxide layer including the desired metal on the substrate;
   (d) repeatedly performing steps (b) and (c) sequentially K times;
   (e) after completion of steps (b), (c) and (d), supplying a silicon source gas into the reactor under reaction conditions to form a second chemical adsorption layer including silicon on the metal oxide layer on the substrate;
   (f) after completion of step (e), supplying a second oxide gas into the reactor under reaction conditions to react with the metal oxide layer and the second chemical adsorption layer including the silicon to form a metal silicate layer;
   (g) repeatedly performing steps (e) and (f) sequentially Q times; and (h) performing the operations of steps (b), (c), (d), (e), (f) and (g) sequentially at least one time, thereby forming a metal silicate layer with a desired thickness, wherein the value of K or of Q ranges from 1 to 10, and also wherein one of the values K and Q is at least 2.

2. The method according to claim 1, further comprising the steps of:
   exhausting unreacted metal source gas remaining in the reactor after each step (b) to clean the inside of the reactor before step (c);
   exhausting unreacted oxide gas and reaction byproducts remaining in the reactor after each step (c) to clean the inside of the reactor before step (d);
   exhausting unreacted silicon source gas remaining in the reactor after each step (e) to clean the inside of the reactor before step (f); and exhausting unreacted oxide gas and reaction byproducts remaining in the reactor after each step (f) to clean the inside of the reactor before step (g).

3. The method according to claim 1, wherein the value K ranges from 2 to 5, and the value of Q is 1.

4. The method according to claim 1, wherein K is 3 and Q is 1.

5. The method according to claim 1, wherein said reaction conditions include a temperature of the reactor in the range of about 250° C. to 600° C..

6. The method according to claim 1, wherein the metal source gas is a material having to general chemical formula $MX_4$, wherein M is a member selected from the group consisting of Hf Zr and Ti, and X is a member selected from the group consisting of F, Cl, Br and I.

7. The method according to claim 1, wherein to metal source gas is a material having the general chemical formula $M(NRR')_4$, wherein M is a member selected from the group consisting of Hf, Zr and Ti; R is a member selected from the group consisting of H, Me, Et and $^i$Pr; and R' is a member selected from the group consisting of H, Me, PA and $^i$Pr.

8. The method according to claim 1, wherein the metal source gas is tetrakis (ethyimethylaniino) hafnium (TEMAH) ($Hf[N(CH_3)C_2H_5]_4$).

9. The method according to claim 8, wherein a pulse time for supplying the metal source gas is in the range of about 0.2 to 2 seconds.

10. The method according to claim 1, wherein the first oxide gas is $O_3$.

11. The method according to claim 1, wherein the silicon source gas is a material having the general chemical formula $Si_nX'_{2n+2}$, wherein n is a number from 1 to 4, and X' is a member selected from the group consisting of NCO, F, Cl, Br and I.

12. The method according to claim 1, wherein the silicon source gas is a material having the general chemical formula $Si_nX'_{2n=2}O_{n-1}$, wherein n is a number from 2 to 5, and X' is a member selected from the group consisting of NCO, F, Cl, Br and I.

13. The method according to claim 1, wherein the silicon source gas is a material having the general chemical formula $SiX''_n(NRR')_{4-n}$, wherein n is a number from 0 to 3; X'' is a member selected from the group consisting of H, F, Cl, Br and I; R is a member selected from the group consisting of H, Me, Et and $^i$Pr; and R' is a member selected from the group consisting of H, Me, Et and $^i$Pr.

14. The method according to claim 1, wherein the silicon source gas is a material having the general chemical formula $NH_n(SiR''_3)_{3-n}$, wherein n is a number from 0 to 2; and R'' is a member selected from the group consisting of H, F, Cl, Br, I, Me, Et and $^i$Pr.

15. The method according to claim 1, wherein the silicon source gas is a material having the general chemical formula of $SiSX_2$, wherein X is a member selected from the group consisting of F, Cl, Br, and I.

16. The method according to claim 1, wherein the silicon source gas is hexachlorodisilane (HCD) ($Si_2Cl_6$).

17. The method according to claim 1, wherein a composition ratio, x, of a metal element relative to the metal plus silicon in the metal silicate ($M_xSi_{1-x}O_2$) layer is in the range of about 0.10 0~95.

18. The method according to claim 1, wherein a composition ratio, x of a metal element relative to the metal plus silicon in the metal silicate ($M_xSi_{1-x}O_2$) layer is in the range of about 0.65~0.85.

19. A method of fabricating a hafnium silicate layer on a substrate using an atomic layer deposition technique, said method comprising the sequential steps of:
(a) loading a substrate into a reactor;
(b) supplying a tetrakis (ethylmethylamino) hafnium (TEMAH) (Hf $[N(CH_3)C_2H_5]_4$) gas into the reactor having the substrate under reaction conditions to form a first chemical adsorption layer including hafnium (Hf) on the substrate;
(c) after completion of step (b), supplying a first oxide gas into the reactor under reaction conditions to react with the first chemical adsorption layer including hafnium (Hf), to form a hafnium (Hf) oxide layer on the substrate;
(d) repeatedly performing steps (b) and (c) sequentially K times;
(e) after completion of steps (b), (c) and (d), supplying a hexachlorodisilane (HCD) ($Si_2Cl_6$) gas into the reactor under reaction conditions to form a second chemical adsorption layer including the silicon on the hafnium (Hf) oxide layer on the substrate;
(f) after completion of step (e), supplying a second oxide gas into the reactor under reaction conditions to react with the hafnium (Hf) oxide layer and the second chemical adsorption layer including the silicon to form a hafnium silicate ($Hf_xSi_{1-x}O_2$) layer;
(g) repeatedly performing steps (e) and (f) sequentially Q times; and
(h) performing the operations of steps (b), (c), (d), (e), (f) and (g) sequentially at least one time, thereby forming a hafnium silicate layer with a desired thickness, wherein the value of K or of Q ranges from 1 to 10, and also wherein one of the values K and Q is at least 2.

20. The method according to claim 19, further comprising the steps of:
exhausting unreacted TEMAH gas remaining in the reactor after each step (b) to clean the inside of the reactor before step (c);
exhausting unreacted oxide gas and reaction byproducts remaining in the reactor after each step (c) to clean the inside of the reactor before step (d);
exhausting unreacted HCD gas remaining in the reactor after each step (e) to clean the inside of the reactor before step (f); and
exhausting unreacted oxide gas and reaction byproducts remaining in the reactor after each step (f) to clean the inside of the reactor before step (g).

21. The method according to claim 19, wherein the value of K ranges from 2 to 5, and the value of Q is 1.

22. The method according to claim 19, wherein K is 3 and Q is 1.

23. The method according to claim 19, wherein said reaction conditions include a temperature of the reactor in the range of about 250° C. to 600° C.

24. The method according to claim 19, wherein a pulse time for supplying the TEMAH gas is in the range of about 0.2 to 2 seconds.

25. The method according to claim 19, wherein the first oxide gas is $O_3$.

26. The method according to claim 19, wherein a composition ratio, x, of a hafnium (Hf) element relative to hafnium plus silicon in the hafnium silicate ($Hf_xSi_{1-x}O_2$) layer is in the range of about 0.10~0.95.

27. The method according to claim 19, wherein a composition ratio, x, of a hafnium (Hf) element relative to hafnium plus silicon in the hafnium silicate ($Hf_xSi_{1-x}O_2$) layer is in the range of about 0.65~0.85.

28. A method of fabricating a hafnium silicate layer on a substrate using an atomic layer deposition technique, said method comprising the sequential steps of:
  (a) loading a substrate into a reactor;
  (b) supplying a tetrakis (ethylmethylamino) hafnium (TEMAH) ($Hf[N(CH_3)C_2H_5]_4$) gas into the reactor having the substrate under reaction conditions to form a first chemical adsorption layer including hafnium (Hf) on the substrate;
  (c) supplying an oxide gas into the reactor under reaction conditions to react with the first chemical adsorption layer including hafnium (Hf) to form a hafnium (Hf) oxide layer on the substrate;
  (d) repeatedly performing steps (b) and (c) sequentially K times;
  (e) supplying a tris(dimethylamino)silane (TDMAS) ($[(CH_3)_2N]_3SiH$) gas into the reactor under reaction conditions to form a second chemical adsorption layer including silicon on the hafnium (Hf) oxide layer on the substrate;
  (f) supplying an oxide gas into the reactor under reaction conditions to react with the hafnium (Hf) oxide layer and the second chemical adsorption layer including the silicon to form a hafnium silicate ($Hf_xSi_{1-x}O_2$) layer;
  (g) repeatedly performing steps (e) and (f) sequentially Q times; and
  (h) performing the operations of steps (b), (c), (d), (e), (f) and (f) sequentially at least one time, thereby forming a hafnium silicate layer with a desired thickness, wherein one of the values K and Q is at least 2.

29. The method according to claim 28, further comprising the steps of:
  exhausting unreacted TEMAH gas remaining in the reactor after each step (b) to clean the inside of the reactor before step (c);
  exhausting unreacted oxide gas and reaction byproducts remaining in the reactor after each step (c) to clean the inside of the reactor before step (d);
  exhausting unreacted TDMAS gas remaining in the reactor after each step (e) to clean the inside of the reactor before step (f); and
  exhausting unreacted oxide gas and reaction byproducts remaining in the reactor after each step (f) to clean the inside of the reactor before step (g).

30. The method according to claim 28, wherein the value of K or of Q ranges from 1 to 10.

31. The method according to claim 28, wherein the value of K ranges from 1 to 3, and the value of Q is 1.

32. The method according to claim 28, wherein said reaction conditions include a temperature of the reactor in the range of about 250° C. to 600° C.

33. The method according to claim 28, wherein a pulse time for supplying the TEMAH gas is in the range of about 0.2 to 2 seconds.

34. The method according to claim 28, wherein the oxide gas is at least one member selected from the group consisting of $H_2O$, $O_3$, $O_2$ and $H_2O_2$.

35. The method according to claim 30, wherein a composition ratio, x, of a hafnium (Hf) element relative to hafnium plus silicon in the hafnium silicate ($Hf_xSi_{1-x}O_2$) layer is in the range of about 0.10~0.95.

36. The method according to claim 28, wherein a composition ratio, x, of a hafnium (Hf) element relative to hafnium plus silicon in the hafnium silicate ($Hf_xSi_{1-x}O_2$) layer is in the range of about 0.65~0.85.

37. The method according to claim 1, wherein the second oxide gas is $H_2O$.

38. The method according to claim 1, wherein the each of the first oxide gas and second oxide gas is at least one member selected from the group consisting of $H_2O$, $O_3$, $O_2$ and $H_2O_2$.

39. The method according to claim 1, wherein the silicon source gas is tris(dimethylamino)silane (TDMAS) ($[(CH_3)_2N]_3SiH$).

40. The method according to claim 19, wherein the second oxide gas is $H_2O$.

41. The method according to claim 19, wherein the each of the first oxide gas and second oxide gas is at least one member selected from the group consisting of $H_2O$, $O_3$, $O_2$ and $H_2O_2$.

* * * * *

UNITED STATES PATENT AND TRADEMARK OFFICE
CERTIFICATE OF CORRECTION

PATENT NO. : 7,651,729 B2
APPLICATION NO. : 11/127748
DATED : January 26, 2010
INVENTOR(S) : Yun-Seok Kim et al.

It is certified that error appears in the above-identified patent and that said Letters Patent is hereby corrected as shown below:

Column 23, line 12, replace "to" with --the--
Column 23, line 14, insert --,-- between "Hf" and "Zr"
Column 23, line 16, replace "to" with --the-- (second occurence)
Column 23, line 22, replace "PA" with --Et--
Column 23, line 24, replace "(ethyimethylaniino)" with --(ethylmethylamino)--
Column 23, line 38, replace "2n=2" with --2n+2--
Column 23, line 63, replace "0.10 0~95." with --0.10~0.95.--
Column 26, line 18, replace "30" with --28--

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,651,729 B2 Page 1 of 1
APPLICATION NO. : 11/127748
DATED : January 26, 2010
INVENTOR(S) : Yun-Seok Kim et al.

It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 1263 days.

Signed and Sealed this

Twenty-second Day of June, 2010

David J. Kappos
*Director of the United States Patent and Trademark Office*